(12) United States Patent
Kozono

(10) Patent No.: US 6,177,718 B1
(45) Date of Patent: Jan. 23, 2001

(54) RESIN-SEALED SEMICONDUCTOR DEVICE

(75) Inventor: Hiroyuki Kozono, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/300,393

(22) Filed: Apr. 27, 1999

(30) Foreign Application Priority Data

Apr. 28, 1998 (JP) ................................................. 10-118607

(51) Int. Cl.[7] ................................................. H01L 23/495
(52) U.S. Cl. ........................ 257/666; 257/676; 257/670; 257/787
(58) Field of Search ..................................... 257/666, 676, 257/669, 670, 674, 787

(56) References Cited

U.S. PATENT DOCUMENTS

| | | | |
|---|---|---|---|
| 4,147,889 | * | 4/1979 | Andrews et al. . |
| 4,234,666 | * | 11/1980 | Gursky . |
| 4,994,895 | * | 2/1991 | Matsuzaki et al. . |
| 5,029,514 | * | 7/1991 | Yalamanchili . |
| 5,252,783 | * | 10/1993 | Baird . |
| 5,281,849 | * | 1/1994 | Singh Deo et al. . |
| 5,428,248 | * | 6/1995 | Cha . |
| 5,519,251 | * | 5/1996 | Sato et al. . |
| 5,554,886 | * | 9/1996 | Song . |
| 5,585,670 | * | 12/1996 | Isshiki et al. . |
| 5,834,837 | * | 11/1998 | Song . |
| 5,861,668 | * | 1/1999 | Cha . |
| 5,898,212 | * | 4/1999 | Kim . |
| 5,898,216 | * | 4/1999 | Steffen . |
| 5,942,794 | * | 8/1999 | Okumura et al. . |
| 5,998,877 | * | 12/1999 | Ohuchi . |
| 6,007,729 | * | 12/1999 | Endoh . |
| 6,054,754 | * | 4/2000 | Bissey . |
| 6,072,228 | * | 6/2000 | Hinkle et al. . |
| 6,078,098 | * | 6/2000 | Ewer . |
| 6,078,099 | * | 6/2000 | Liu et al. . |
| 6,111,312 | * | 8/2000 | Hirumuta et al. . |

* cited by examiner

Primary Examiner—Sheila V. Clark
(74) Attorney, Agent, or Firm—Oblon, Spivak, McClelland, Maier & Neustadt, P.C.

(57) ABSTRACT

A semiconductor chip is secured on a die-pad which has been depressed. One end of a tie-bar is combined with the die-pad. One of a lead is connected to the semiconductor chip by, for example, a bonding wire. A molded resin block covers up the die-pad, semiconductor chip and lead, and has an upper surface, a lower surface and sides. The other end of the tie-bar and the other end of the lead are exposed at the lower surface of the resin block. The surfaces of the tie-bar and lead, which are exposed, lie in substantially the same plane as at least the lower surface of the resin block. The lower surface of the die-pad may be exposed at the upper surface of the resin block, and the lower surface of the die-pad, which is exposed outside the resin block, may be set in substantially the same plane as the upper surface of the resin block.

14 Claims, 15 Drawing Sheets

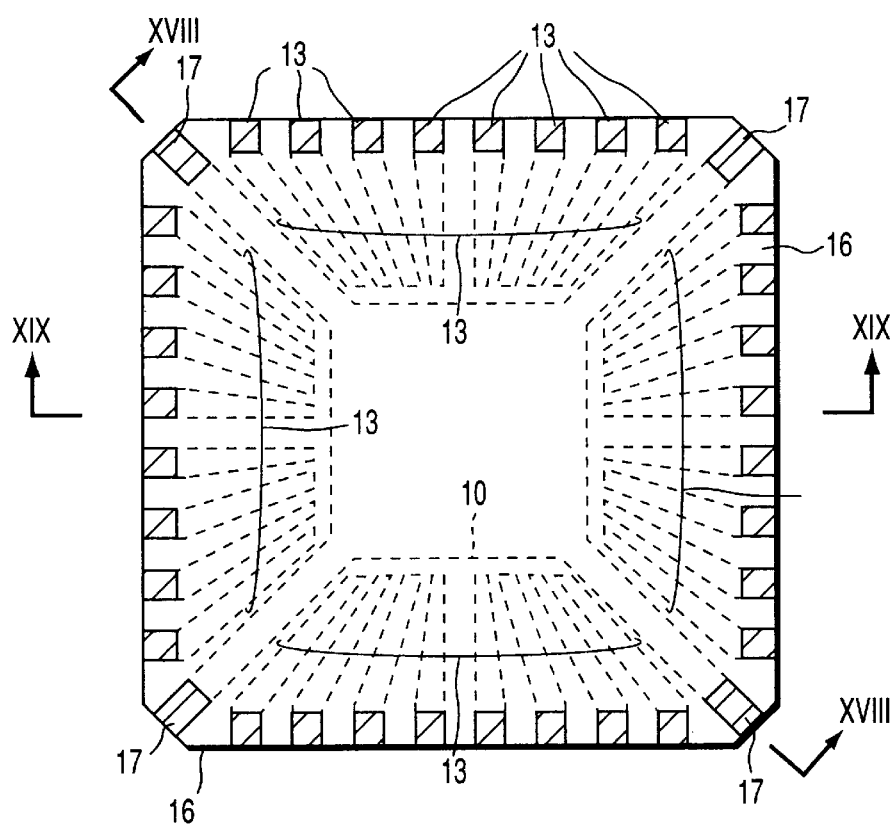
F I G. 16
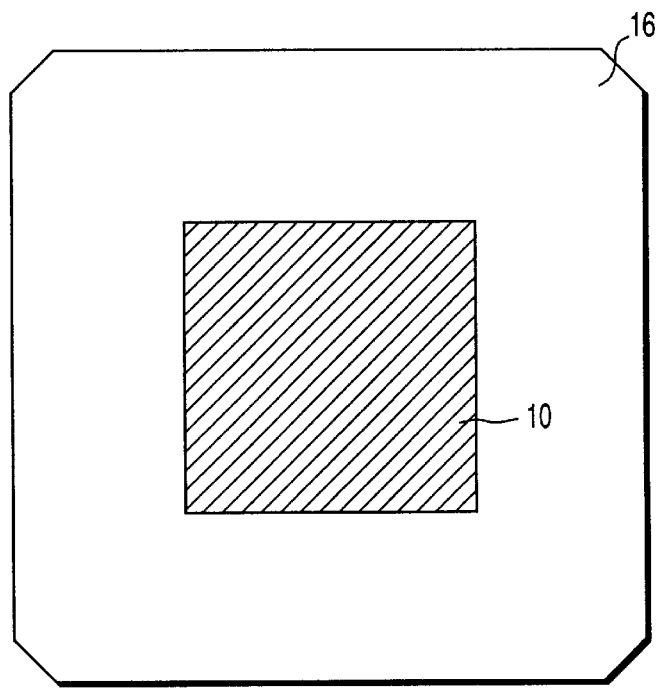
F I G. 17

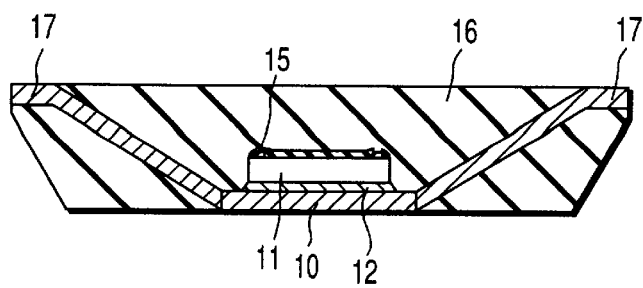
F I G. 18
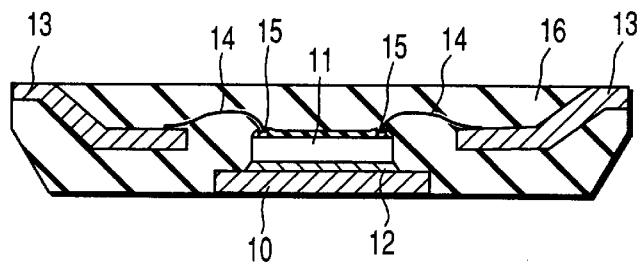
F I G. 19
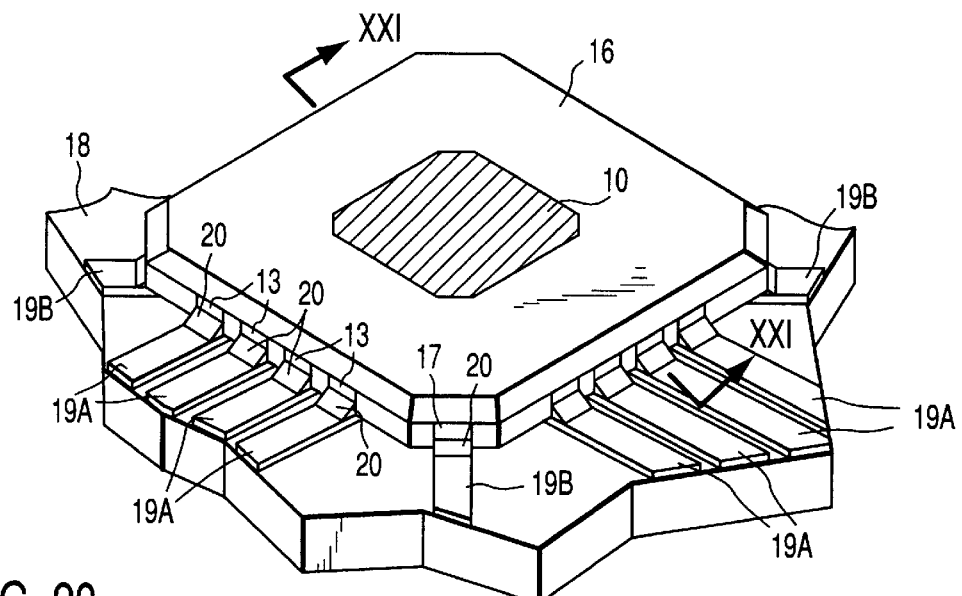
F I G. 20
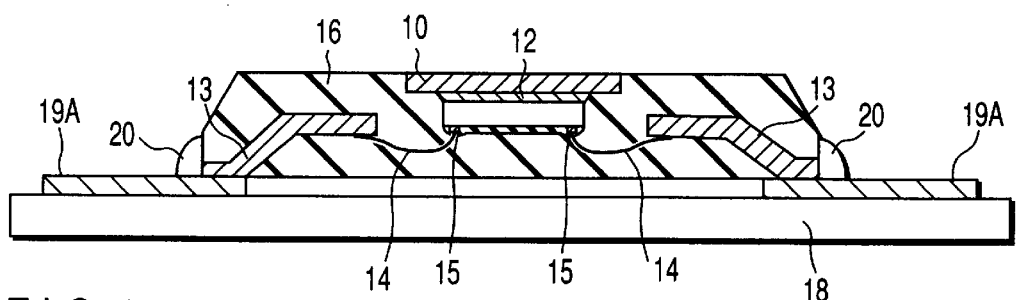
F I G. 21

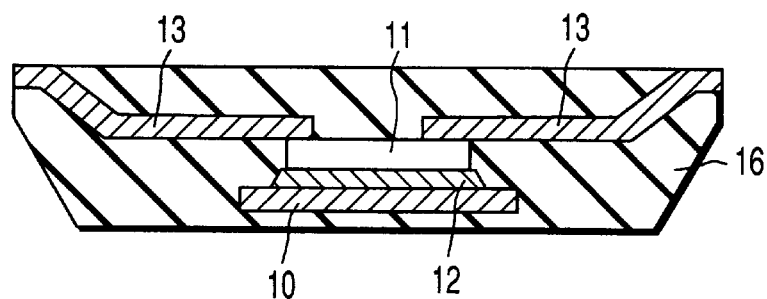
F I G. 33
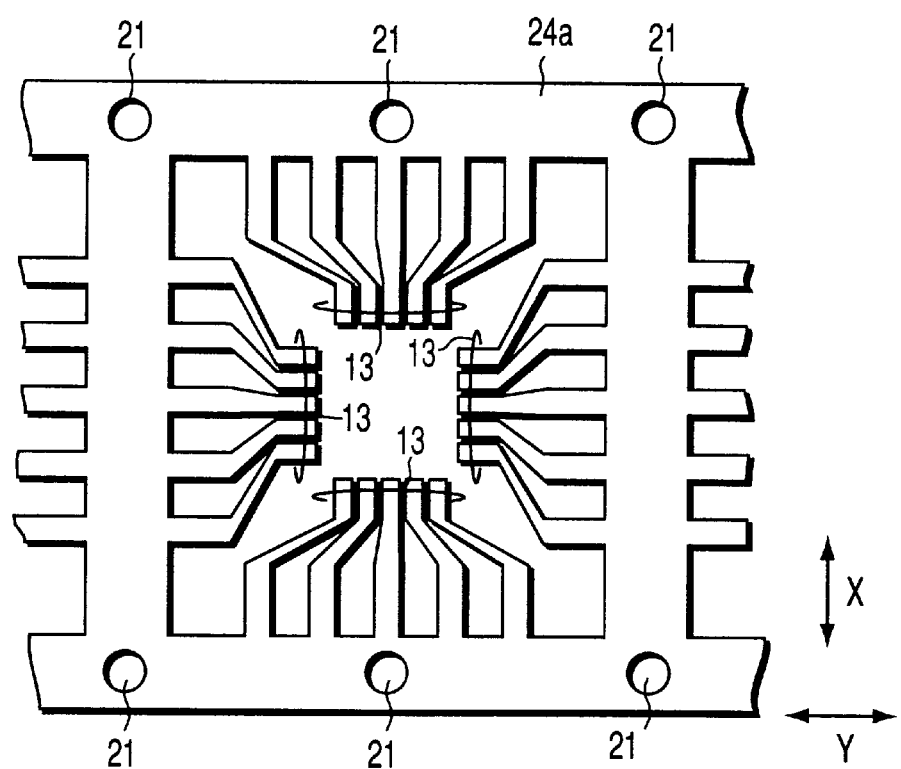
F I G. 34

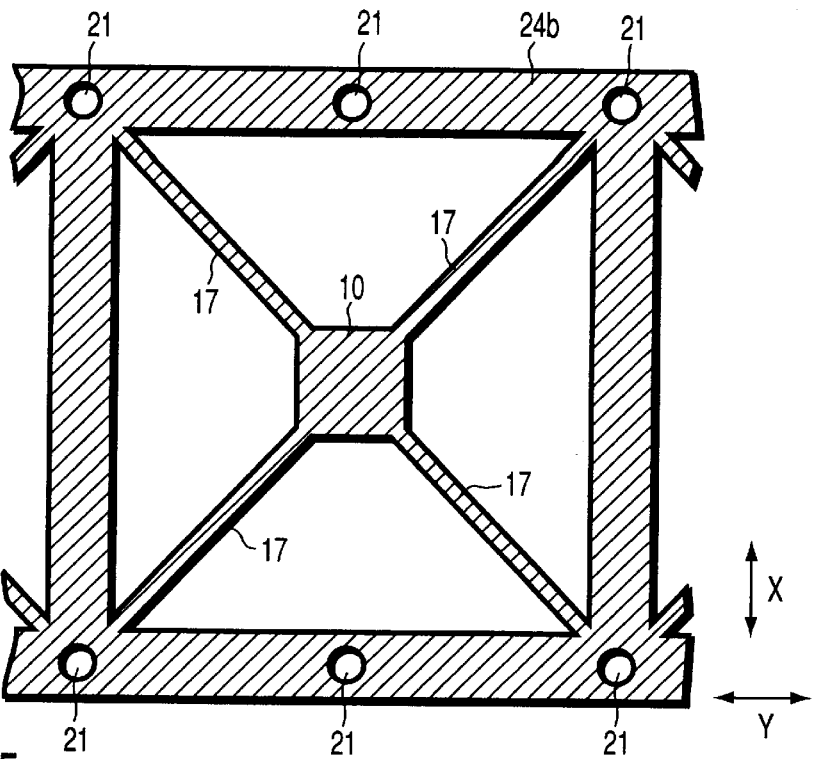
F I G. 35
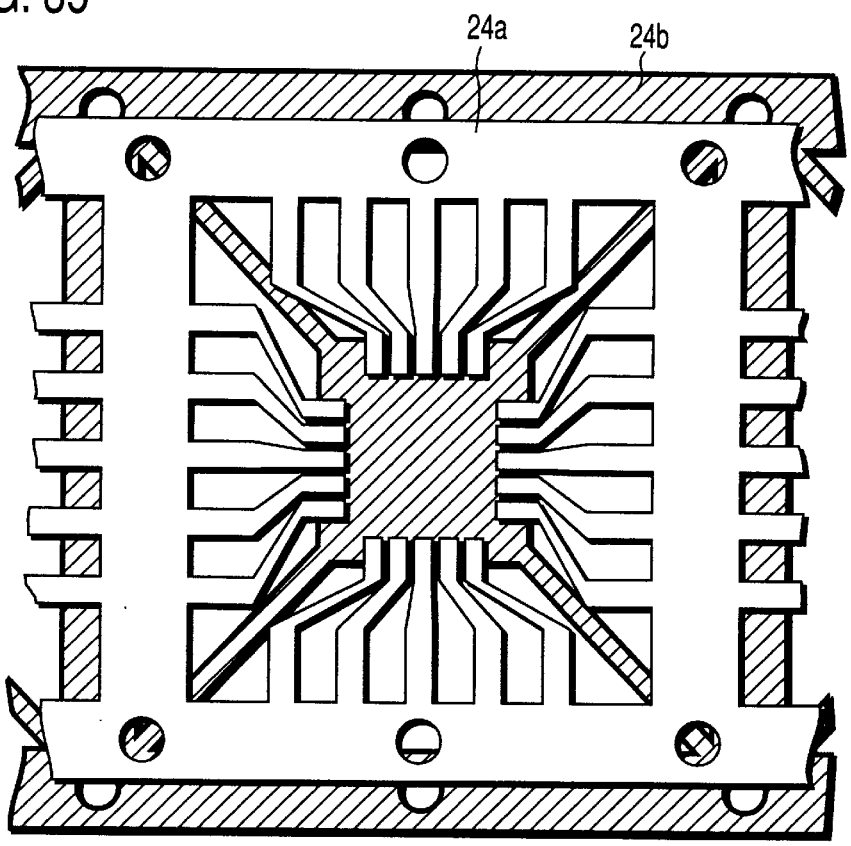
F I G. 36

RESIN-SEALED SEMICONDUCTOR DEVICE

BACKGROUND OF THE INVENTION

The present invention relates to a resin-sealed semiconductor device.

A resin-sealed semiconductor device is a device having a semiconductor chip (IC) package made of molding resin. The resin-sealed semiconductor device is inexpensive and excels in mass-productivity. Therefore, it is most generally developed and manufactured in the field of semiconductor devices.

FIG. 1 is a plan view of a conventional resin-sealed semiconductor device. FIG. 2 is a sectional view, taken along line II—II in FIG. 1. FIG. 3 is a sectional view, taken along line III—III in FIG. 1.

A semiconductor chip 11 is mounted on a die-pad 10. The chip 11 is secured to the die-pad 10 with electrically conductive adhesive 12 such as silver paste. Tie-bars 17 tie the die-pad 10 to a lead frame in the course of manufacturing a resin-sealed semiconductor device. A plurality of leads 13 are arranged around the die-pad 10. Bonding wires 14 connect the leads 13 to the electrodes (pads) 15 of the semiconductor chip 11. Resin 16 covers the semiconductor chip 11. Those parts of the leads 13, which are in the resin 16, are called inner leads. Those parts of the leads 13, which are outside the resin 16, are called outer leads.

The die-pad 10, leads 13 and tie-bars 17 are made of metal such as copper, copper alloy or iron-nickel alloy (Fe—42Ni). The distal portion (bonding portion) of each lead (inner lead) 13 is plated with metal such as gold or tin. The bonding wires 14 are made of metal such as copper, copper alloy or gold. The electrodes 15 of the semiconductor chip 11 are made of metal such as aluminum.

The leads (outer leads) 13 are made in the form of a Gull-wing so as to easily contact the wires provided on a printed circuit board. The tie-bars 17 is used to tie the die-pad 10 to the lead frame in the course of manufacturing the resin-sealed semiconductor device. Those parts of the tie-bars, which are outside the resin 16, are therefore finally removed. Hence, the tie-bars 17 will exists in the resin 16 only.

The die-pad 10 is fixed at the ground potential in order to stabilize the operation of the integrated circuit provided within the semiconductor chip 11. A method of fixing the die-pad 10 at the ground potential is known, in which one of the leads 13 and the die-pad 10 are connected to each other and the ground potential is applied to this lead 13.

In this case, however, the ground potential is applied from the lead 13 to the die-pad 10. Due to the resistance components of the leads, bonding wires and die-pad, it is difficult to stabilize the entire lower surface of the semiconductor chip 11 at the ground potential.

Further, since one of the leads 13 must be used to set the die-pad 10 at a specific potential, the semiconductor device needs to have more pins (outer leads) than otherwise. Still further, since the lead (outer leads) are bent in Gull-wing form, there is limit to miniaturization and thickness reduction of the semiconductor device.

BRIEF SUMMARY OF THE INVENTION

The object of this invention is to provide a resin-sealed semiconductor device which has a novel structure and which can be made small and thin, to reliably set the entire lower surface of a semiconductor chip at the ground potential by means of a novel method of setting the potential of a die-pad, and to increase the mount strength of a semiconductor device with respect to a printed circuit board.

A resin-sealed semiconductor device according to the present invention comprises: a die-pad; a semiconductor chip arranged on the die-pad; a tie-bar having a first end and a second end, the first end combined with the die-pad; a lead having a first end and a second end; a resin block covering up the die-pad, the semiconductor chip, the tie-bar and the lead and having an upper surface, a lower surface and sides. The second end of the tie-bar and the second end of the lead are exposed at the lower surface of the resin block. The surfaces of the tie-bar and lead, which are exposed outside the resin block, lie in substantially the same plane as at least the lower surface of the resin block.

A lead frame for use in a resin-sealed semiconductor device, according to this invention, comprises: a main body; a die-pad for supporting a semiconductor chip; a tie-bar having a first end and a second end, the second combined with the main body; and a lead having a first end arranged near the die-pad and a second end combined with the main body. The die-pad, the tie-bar and the lead are depressed. The first end of the lead is located closer to the main body than to the die-pad. The second end of the tie-bar and the second end of the lead lie in a plane defined by the main body.

A method of manufacturing a resin-sealed semiconductor device, according to the invention, comprises the steps of: depressing a die-pad, tie-bar and lead of a lead frame; securing a semiconductor chip on the die-pad of the lead frame; connecting the lead and the semiconductor chip; applying resin by means of a resin-molding process, forming a resin block and covering the die-pad, tie-bar and lead of the lead frame; and cutting the tie-bar and the lead, thereby exposing one end of the tie bar and one end of the lead, at a lower surface of the resin block, and thereby setting surfaces of the tie-bar and lead, which are exposed outside the resin block, in substantially the same plane as at least the lower surface of the resin block.

A method of manufacturing a resin-sealed semiconductor device, according to the invention, comprises the steps of: depressing a lead of a lead frame which also has a die-pad and a tie-bar; securing a semiconductor chip on the die-pad of the lead frame; connecting the lead and the semiconductor chip; applying resin by means of a resin-molding process, forming a resin block and covering the die-pad, tie-bar and lead of the lead frame; and cutting the tie-bar and the lead, thereby exposing one end of the tie bar and one end of the lead, at a lower surface of the resin block, and thereby setting surfaces of the tie-bar and lead, which are exposed outside the resin block, in substantially the same plane as at least the lower surface of the resin block.

A method of manufacturing a resin-sealed semiconductor device, according to this invention, comprises the steps of: depressing a die-pad and tie-bar of a first lead frame; depressing a lead of a second lead frame; securing a semiconductor chip on the die-pad of the first lead frame; placing the first and second lead frames, one upon the other; connecting the lead and the semiconductor chip; applying resin by means of a resin-molding process, forming a resin block and covering the die-pad, tie-bar and lead of the lead frame; and cutting the tie-bar and the lead, thereby exposing one end of the tie bar and one end of the lead, at a lower surface of the resin block, and thereby setting surfaces of the tie-bar and lead, which are exposed outside the resin block, in substantially the same plane as at least the lower surface of the resin block.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 16 is a top view showing the second example of the semiconductor device according to the invention;

FIG. 17 is a bottom view showing the second example of the semiconductor device according to the invention;

FIG. 18 is a sectional view, taken along line XVIII—XVIII in FIG. 16;

FIG. 19 is a sectional view, taken along line XIX—XIX in FIG. 16;

FIG. 20 is a perspective view showing the semiconductor device of FIGS. 15 to 19 mounted on a printed circuit board;

FIG. 21 is a sectional view, taken along line XXI—XXI in FIG. 20;

FIG. 33 is a sectional view, taken along line XXXIII—XXXIII in FIG. 31;

FIG. 34 is a plan view one of two types of lead frames for use in a fourth example of the semiconductor device according to this invention;

FIG. 35 is a plan view the other of the two types of lead frames for use in the fourth example of the semiconductor device according to the present invention;

FIG. 36 is a plan view showing the lead frames of FIGS. 34 and 35 placed one upon the other;

DETAILED DESCRIPTION OF THE INVENTION

The resin-sealed semiconductor device according to the present invention will be described, with reference to the accompanying drawings.

Figure 1:
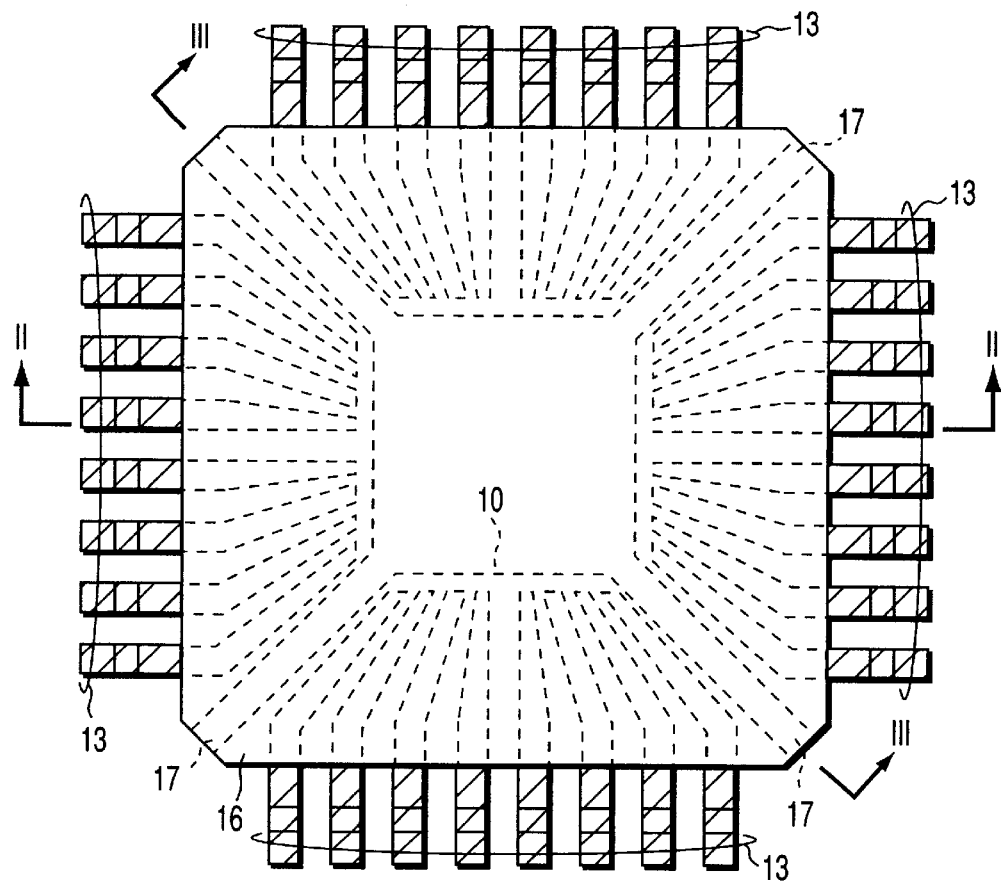
FIG. 1 is a plan view of a conventional resin-sealed semiconductor device.
Figure 2:
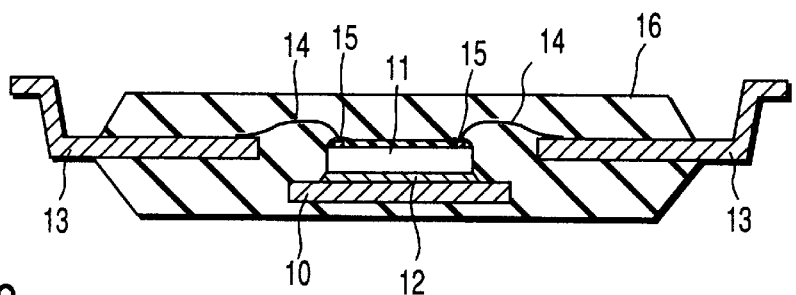
FIG. 2 is a sectional view, taken along line II—II in FIG. 1.
Figure 3:
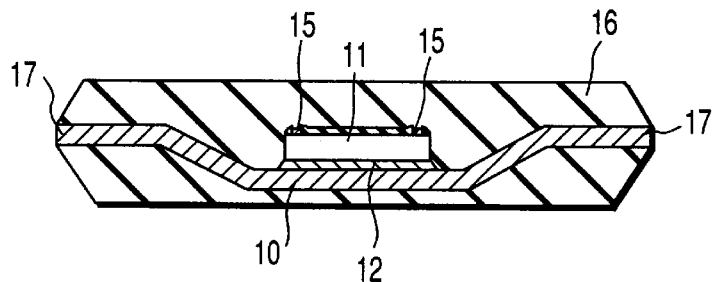
FIG. 3 is a sectional view, taken along line III—III in FIG. 1.
Figure 4:
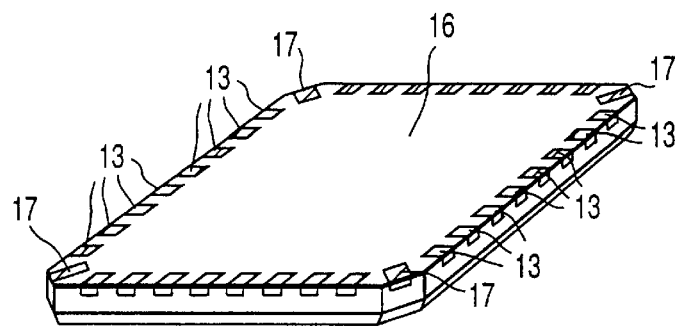
FIG. 4 is a perspective view showing a first example of the semiconductor device according to the present invention.

FIG. 4 shows an outer appearance of the first example of the resin-sealed semiconductor device according to this invention.

One characterizing feature of the semiconductor device according to the invention resides in that a plurality of leads 13 do not protrude from a resin block 16. That is, the leads 13 have one end exposed at the edge part of the resin block 16, which is a rectangular package. The surfaces of the leads 13, which are exposed, lie in substantially the same plane as the surfaces (lower surface and sides) of the resin block 16. The end of each lead 13 serves as an outer electrode of the semiconductor device. The lower surface of the resin block 16 is that surface which will oppose a printed circuit board when the semiconductor device is mounted on the printed circuit board.

This feature can contribute to the miniaturization and thickness reduction of the semiconductor device. That is, the semiconductor device according to the invention can have the same size as the package (i.e., the resin block) since none of the leads 13 extend from the resin block 16.

Another characterizing feature of the semiconductor device according to the invention resides in that a plurality of tie-bars 17 have one end exposed at the corner parts of the rectangular package, i.e., the resin block 16, and that the end of each tie-bar 17 serves as an outer electrode of the semiconductor device. Further, the surfaces of the tie-bars 17, which are exposed, lie in substantially the same plane as the surfaces (lower surface and sides) of the resin block 16.

Thanks to the other feature, the ground potential can be applied from the tie-bars 17 to the die-pad. This makes it possible to reliably set the entire lower surface of the semiconductor chip at the ground potential.

The plurality of tie-bars 17 serve to greatly increase the mount strength of the semiconductor device with respect to the printed circuit board. For example, if the tie-bars 17 are secured at one end to the wires on the printed circuit board, by using solder, the semiconductor device will be firmly fixed to the printed circuit board.

The plurality of tie-bars 17 are thus used to apply a potential to the tie-pad and to increase the mount strength of the semiconductor device with respect to the printed circuit board. Nonetheless, the plurality of tie-bars 17 may be used to achieve only one of these functions.

Figure 5:
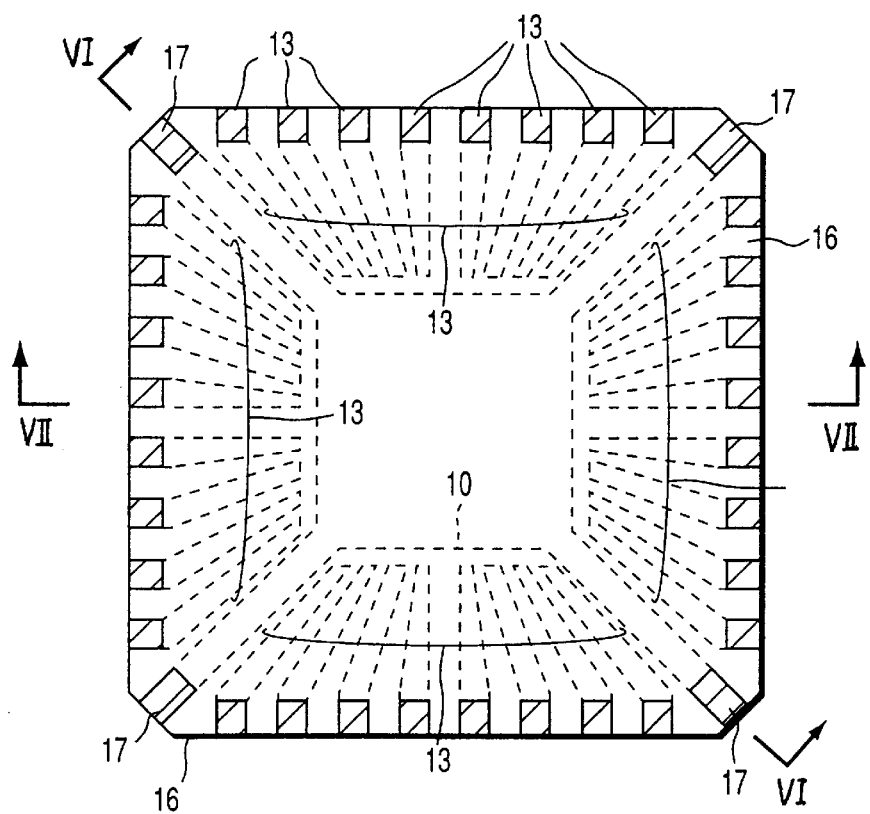
FIG. 5 is a plane view showing the first example of the semiconductor device according to this invention.
Figure 6:
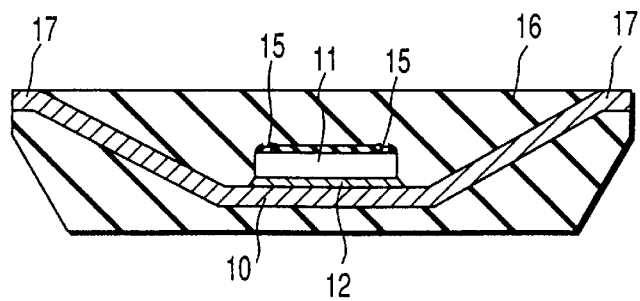
FIG. 6 is a sectional view, taken along line VI—VI in FIG. 5.
Figure 7:
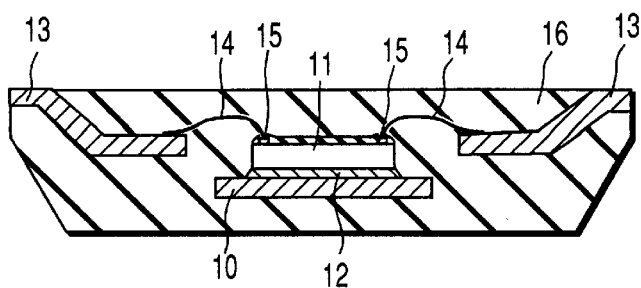
FIG. 7 is a sectional view, taken along line VII—VII in FIG. 5.

FIG. 5 is a plan view of the first example of the resin-sealed semiconductor device according to this invention. FIG. 6 is a sectional view, taken along line VI—VI in FIG. 5. FIG. 7 is a sectional view, taken along line VII—VII in FIG. 5.

A semiconductor chip 11 is mounted on the die-pad 10. The semiconductor chip 11 is secured to the die-pad 10 with electrically conductive adhesive 12 such as silver paste. The resin block 16 seals the die-pad 10 and the semiconductor chip 11. The tie-bars 17 extend from the corner parts of the die-pad 10 to the corner parts of the resin block 16 (package). The tie-bars 17 tie the die-pad 10 to a lead frame in the course of manufacturing the resin-sealed semiconductor device.

One end of each tie-bar 17 is exposed at a corner part of the resin block 16 which is a rectangular package. The surfaces of the tie-bars 17, which are exposed, lie in substantially the same plane as the surfaces (lower surface and sides) of the resin block 16. That end of each tie-bar 17 serves as an outer electrode of the semiconductor device, i.e., an outer electrode for applying the ground potential to the die-pad 10. Further, that end of each tie-bar 17 may be used as a holding part for increasing the mount strength of the semiconductor device with respect to a printed circuit board.

The plurality of leads 13 are arranged around the die-pad 10. Bonding wires 14 connect the leads 13 to the electrodes (pads) 15 of the semiconductor chip 11.

The plurality of leads 13 do not protrude from the resin block 16. That is, one end of each lead 13 is exposed at the edge part of the resin block 16, which is a rectangular package. The surfaces of the leads 13, which are exposed, lie in substantially the same plane as the surfaces (lower surface and sides) of the resin block 16. The end of each lead 13 serves as an outer electrode of the semiconductor device.

In the present example, the leads 13 and the tie-bars 17 are exposed at the lower surface and sides of the resin block (package) 16. The surfaces of the leads 13 and tie-bars 17, which are exposed, lie in substantially the same plane as the surfaces (lower surface and sides) of the resin block 16. Instead, the leads 13 and the tie-bars 17 may be exposed at only the lower surface of the package, and the surfaces of the leads 13 and tie-bars 17, which are exposed, may be placed in substantially the same plane as the lower surface of the package.

The leads 13 and tie-bars 17 are depressed in order to embed the leads 13 and tie-bars 17 in the resin block 16, except for their distal parts (outer electrodes), thereby to enhance the reliability of the semiconductor device. In the present invention, the ends of the leads 13 and tie-bars 17 lie in substantially the same plane as the surfaces (particularly, lower surface) of the resin block 16. Hence, all leads 13 and all tie-bars 17 do not lie in the same plane and are prevented from slipping out of the resin block 16.

The leads 13 and tie-bars 17 are made of metal such as copper, copper alloy or iron-nickel alloy (Fe—42Ni). The end portion (bonding portion) of each lead (inner lead) 13 is plated with metal such as gold or tin. The bonding wires 14 are made of metal such as copper, copper alloy or gold. The electrodes 15 of the semiconductor chip 11 are made of metal such as aluminum.

Figure 8:
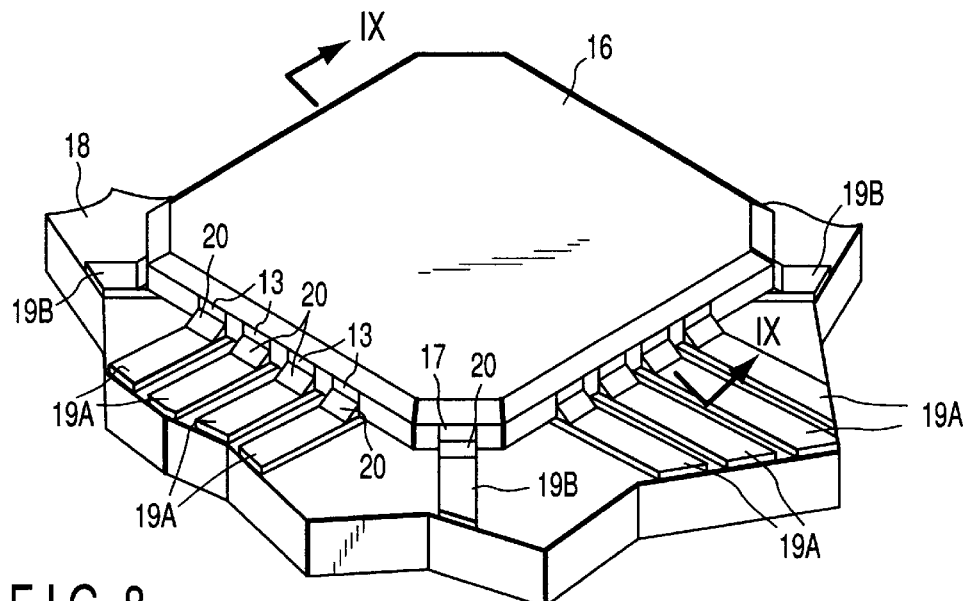
FIG. 8 is a perspective view showing the semiconductor device of FIGS. 4 to 7 mounted on a printed circuit board.
Figure 9:
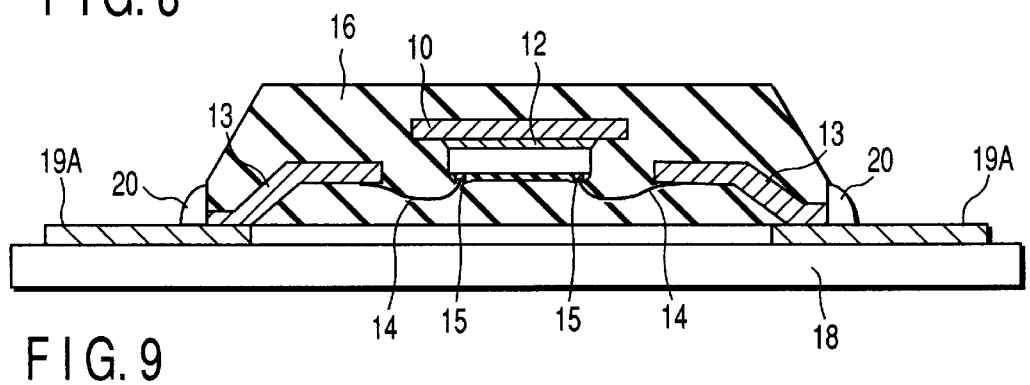
FIG. 9 is a sectional view, taken along line IX—IX in FIG. 8.

FIG. 8 shows the resin-sealed semiconductor device of FIGS. 4 to 7 mounted on a printed circuit board. FIG. 9 is a sectional view, taken along line IX—IX in FIG. 8.

Wires 19A and 19B are formed on an insulting board 18 made of insulating material such as epoxy resin. The wires 19A and 19B are made from a film of metal such as copper or copper alloy. The wires 19A are arranged, corresponding to the ends (outer electrodes) of the leads 13 of the semiconductor device. The wires 19B are arranged, corresponding to the ends (used as outer electrodes or holding parts of the semiconductor device) of the tie-bars 17. The leads 13 are combined with the wires 19A, by the use of solder 20. Similarly, the tie-bars 17 are combined with the wires 19B, by the use of solder 20.

Figure 11:
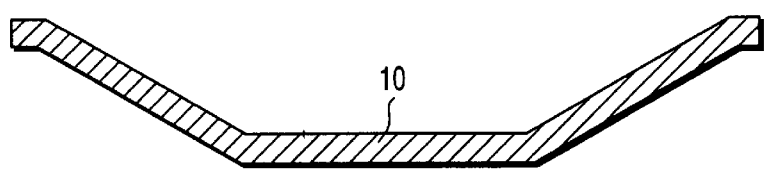
FIG. 11 is a sectional view, taken along line XI—XI in FIG. 10.
Figure 12:
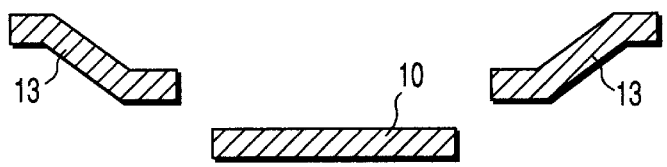
FIG. 12 is a sectional view, taken along line XII—XII in FIG. 10.
Figure 10:
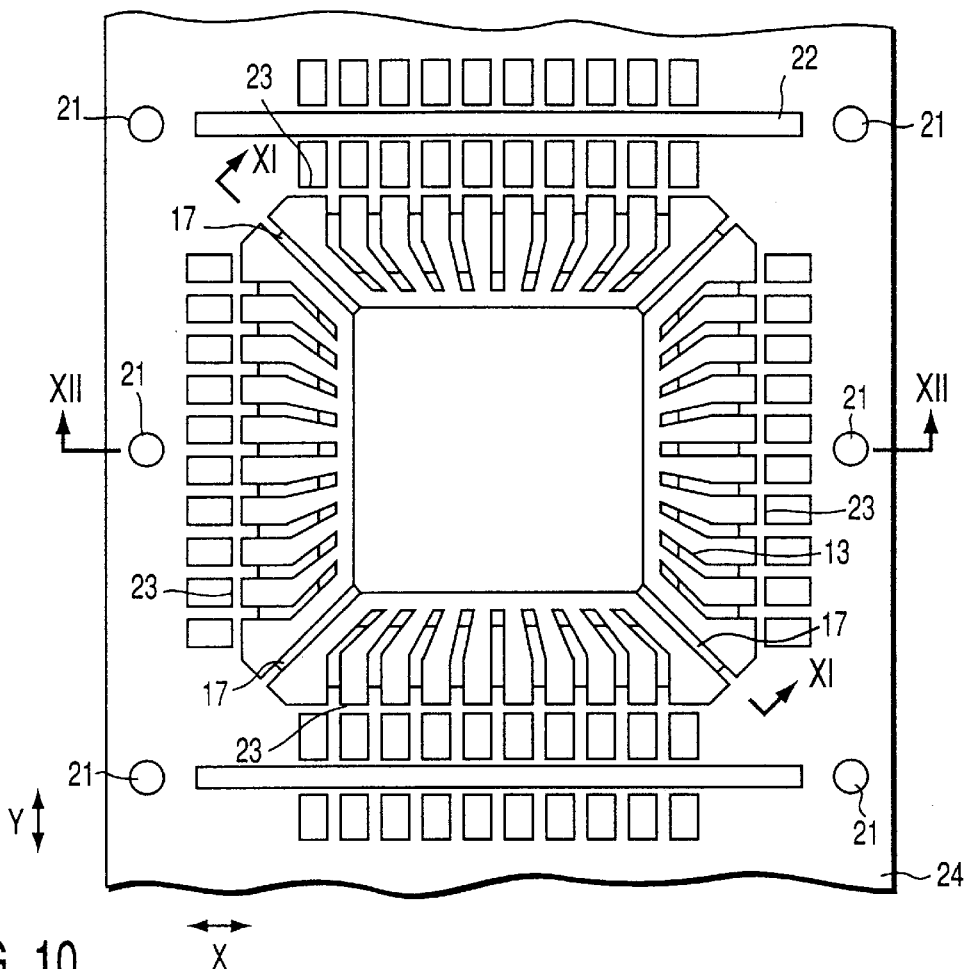
FIG. 10 is a plan view showing a lead frame for use in the first example of the semiconductor device according to this invention.

FIG. 10 shows the lead frame 24 for use in the manufacture of the resin-sealed semiconductor device shown in FIGS. 4 to 7. FIG. 11 is a sectional view, taken along line XI—XI in FIG. 10. FIG. 12 is a sectional view, taken along line XII—XII in FIG. 10.

The lead frame 24 is rectangular, short in X direction and long in Y direction. A plurality of sprocket holes 21 are made in and arranged along the two edge parts of the lead frame 24 which are spaced apart in the X direction. Slits 22 extending in the X direction separate a plurality of semiconductor devices. In other words, one semiconductor device is formed between two adjacent slits 22.

The tie-bars 17 tie the die-pad 10 to the lead frame 24. In this example, each tie-bar 17 has one end combined with the lead frame 24 and the other end combined with a corner part of the square die-pad 10. The tie-bars 17 are depressed. Therefore, the surfaces of the tie-bars 17 are parallel to the surface of the die-pad 10 and not at the same level as the surface of the die-pad 10.

Each of the leads 13 has one end combined with the lead frame 24 and the end arranged near the edge part of the die-pad 10. The leads 13 are connected together by dam-bars 23. The dam-bars 23 secure the leads 13 and prevent resin from leaking in the resin-molding process. The leads 13 are depressed like the tie-bars 17. However, those parts of the leads 13, which are close to the die-pad 10, exist at a higher level than the die-pad 10. This serves the purpose of placing the bonding surfaces of the leads 13 at a level substantially equal or similar to the level of the electrode surface of the semiconductor chip so that the lead may easily be connected to the semiconductor chip by bonding wires.

In the first example of the resin-sealed semiconductor device according to the present invention, the leads 13 have one end exposed at the edge parts of the resin block 16, and the surfaces of the leads 13, which are exposed, lie in substantially the same plane as the surfaces (lower surface and sides) of the resin block 16. That is, the leads 13 do not protrude from the resin block 16 in the present invention. This contributes to the miniaturization and thickness reduction of the semiconductor device.

In the first example of the resin-sealed semiconductor device according to this invention, the tie-bars 17 have one end exposed at the corner parts of the package, i.e., the resin block 16. The surfaces of the tie-bars 17, which are exposed, lie in substantially the same plane as the surfaces (lower surface and sides) of the resin block 16. Further, the ground potential can be applied to the die-pad 10 since one end of each tie-bar 17 is used as an outer electrode. Thus, the entire lower surface of the semiconductor chip can be reliably set at the ground potential.

Even if one end of each tie-bar 17 is not used as an outer electrode, the mount strength of the semiconductor device can be increased, provided that that end of each tie-bar 17 is combined with a wire on the printed circuit board by the use of solder. That is, the semiconductor device can be firmly secured to the printed circuit board if that end of each tie-bar 17 is soldered to a wire on the board, no matter whether or not that end of the tie-bar serves as an outer electrode.

In the first example of the resin-sealed semiconductor device according to the present invention, the leads 13 and tie-bars 17 are depressed and are embedded in the resin block 16, except their distal end portions (outer electrodes). Hence, the die-pad 10, leads 13 and tie-bars 17 of the semiconductor device are prevented from slipping from the resin block 16. This helps to enhance the reliability of the device.

The package of the resin-sealed semiconductor device according to the present invention can be made about 0.8 mm thick. Obviously, the package of the semiconductor device of the invention is thinner than the package of the conventional BGA (Ball Grid Array) package that has a thickness of about 1.4 mm. In the semiconductor device of this invention, solder balls can be formed on those ends of the leads 13 and tie-bars 17, which serve as outer electrodes, thereby to form a BGA package.

Figure 13:
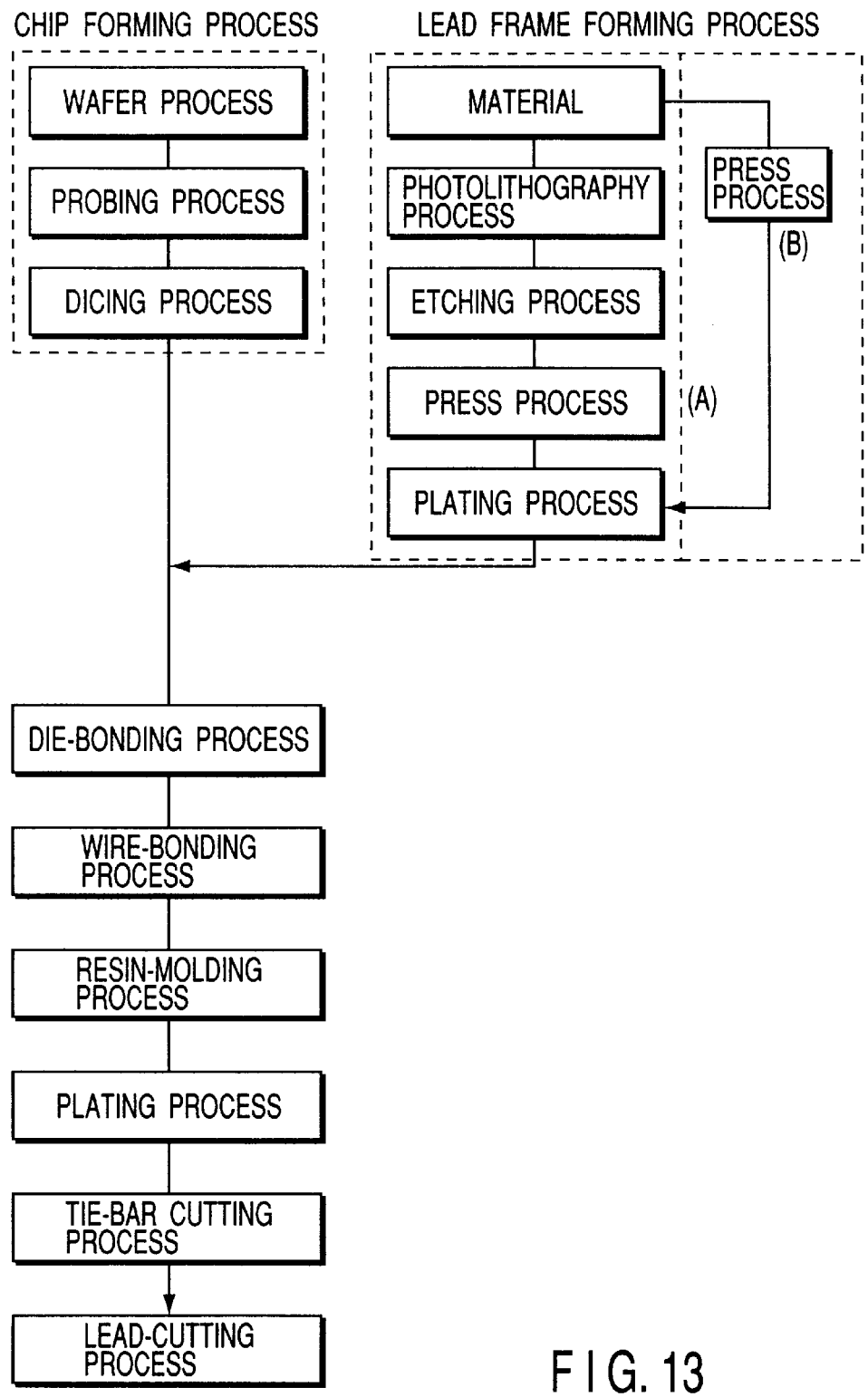
FIG. 13 is a diagram illustrating the method of manufacturing the first example of the semiconductor device according to the invention.

FIG. 13 is a diagram illustrating the method of manufacturing the first example of the semiconductor device according to the invention.

This method is different from the conventional method in three respects. First, the lead frame forming process includes a step of depressing the leads and the tie-bars. Second, not only the leads, but also the tie-bars are plated with prescribed metal. Third, a lead-forming process, usually following a lead-cutting process, need not be performed.

The method of manufacturing the resin-sealed semiconductor device according to the invention will be described below.

In the process of forming semiconductor chips, a plurality of chip regions (LSI) are formed in a wafer by means of a wafer process. Then, a probe is brought into contact with each chip region in the wafer, thereby testing the chip region (LSI), by means of a probing process. Thereafter, a dicing process is conducted, cutting the wafer and separating the chip regions from one another.

In the lead frame forming process, a thin plate (material) made of copper, copper alloy or iron-nickel alloy (Fe—42Ni) is prepared. Then, in process A, a photoresist film is formed on the thin plate by photolithography process. An etching process is performed on the thin plate, by using the photoresist film as mask, thereby forming a lead frame having a specific shape. Thereafter, the leads and tie-bar of the lead frame are depressed by a press process, and the lead frame is plated by a plating process.

Process B may be employed in place of process A. In process B, neither photolithography process nor etching process is conducted. That is, the thin plate is punched out in process B, thus forming a lead frame and, at the same time, depressing the leads and tie-bars.

A die-bonding process is performed, in which adhesive is applied to bond a semiconductor chip (die) to the die-pad of the lead frame. Next, a wire-bonding process is carried out, in which the electrodes of the semiconductor chip are electrically connected to the leads by bonding wires.

In the resin-molding process, the semiconductor chip is covered up with the resin (package) by the use of a molding die.

Figure 14:
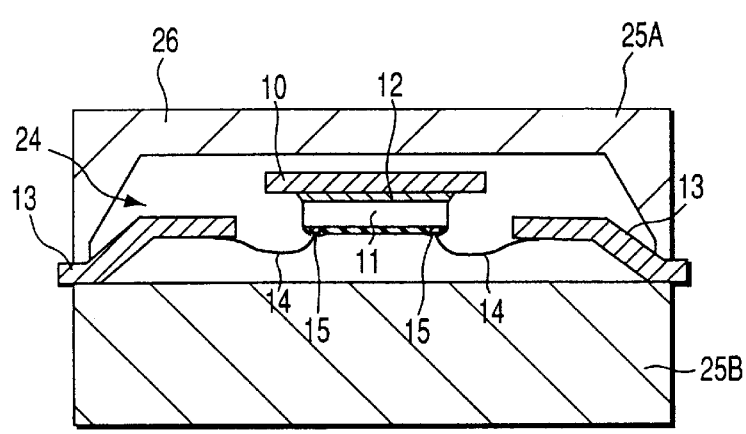
FIG. 14 is a sectional view depicting the resin mold process.

FIG. 14 illustrates the resin-molding process. In the present example, the upper die 25A has a recess, and the under die 25B is made flat. The lead frame 24 is arranged on the under die 25B. When the upper die 25A and the under die 25B are combined together, a cavity 26 is formed in the combined die and the semiconductor chip 11 is arranged in the cavity 26. The cavity 26 is filled with resin in the resin-molding process.

The sides of the recess made in the upper die 25A are inclined, making it easy to remove the semiconductor device after the resin has solidified in the cavity 26.

Next, a plating process is conduced, plating those parts of the leads and tie-bars, which will be outer electrodes, with predetermined metal.

Thereafter, a tie-bar cutting process is performed, cutting the tie-bars of the lead frame. Since the tie-bars are cut at the root in this process, the surfaces of the tie-bars, which are exposed, lie in substantially the same plane as the surfaces (lower surface and sides) of the resin block (package). The lower surfaces of the tie-bars, which are exposed outside the resin block, are covered with film of the predetermined metal which has been formed in the plating process described above.

A lead-cutting process is performed, cutting the leads and dam-bars of the lead frame. Since the leads are cut at the root in this process, the surfaces of the lead, which are exposed, lie in substantially the same plane as the surfaces (lower surface and sides) of the resin block (package). The lower surfaces of the leads, which are exposed outside the resin block, are covered with film of the predetermined metal which has been formed in the plating process described above.

The tie-bar cutting process and the lead-cutting process may be carried out at the same time.

Thus, the resin-sealed semiconductor device of this invention is made complete.

Figure 15:
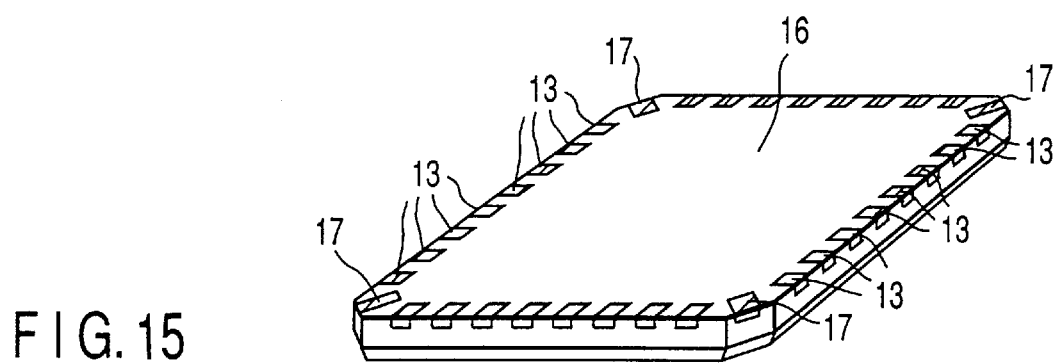
FIG. 15 is a perspective view showing a second example of the semiconductor device according to the present invention.

FIG. 15 shows an outer appearance of the second example of the semiconductor device according to the present invention.

The second example of the semiconductor device has all features of the first example of the semiconductor device, which has been described.

A plurality of leads 13 are exposed at one end at the edge parts of a resin block 16, i.e., a rectangular package. The surfaces of the leads 13, which are exposed, lie in substantially the same plane as the surfaces (lower surface and sides) of the resin block 16. That end of each lead 13 serves as an outer electrode of the semiconductor device.

A plurality of tie-bar 17 have one end exposed at the corner parts of the resin block 16, i.e., the rectangular package. The surfaces of the tie-bars 17, which are exposed, lie in substantially the same plane as the surfaces (lower surface and sides) of the resin block 16. That end of each tie-bar 17 serves as an outer electrode of the semiconductor device.

These features of the device contribute to the miniaturization and thickness reduction of the semiconductor device. Further, the ground potential can be applied from the tie-bars 17 to the die-pad, making it possible to set reliably the entire lower surface of the semiconductor chip at the ground potential.

Furthermore, the tie-bars 17 serve to increase the mount strength of the semiconductor device with respect to a printed circuit board. For example, if the tie-bars 17 are secured at one end to the wires of a printed circuit board by the use of solder, the semiconductor device will be firmly secured to the printed circuit board.

FIGS. 16 and 17 are plan views of the second example of the semiconductor device according to the invention. FIG. 18 is a sectional view, taken along line XVIII—XVIII in FIG. 16, and FIG. 19 is a sectional view, taken along line XIX—XIX in FIG. 16.

This example of the semiconductor device is different from the first example in two respects in that the lower surface of the die-pad 10 (the surface opposing the surface on which the semiconductor chip is arranged) is exposed outside the resin block 16 and lies in substantially the same plane as the surface (upper surface) of the resin block 16. The upper surface of the resin block 16 is one that faces away from the surface which opposes the printed circuit board after the semiconductor device is mounted on the printed circuit board.

The second example of the semiconductor device will be described below in detail.

A semiconductor chip 11 is mounted on the die-pad 10. The semiconductor chip 11 is fixed to the die-pad 10 with electrically conductive adhesive 12 such as silver paste. The resin block 16 covers up the die-pad 10 and the semiconductor chip 11. The lower surface of the die-pad 10 is exposed outside the resin block 16 and lies in substantially the same plane as the surface (upper surface) of the resin block 16.

Hence, the heat generated in the semiconductor chip 11 is released from the semiconductor device through the die-pad 10. The semiconductor device excels in terms of heat radiation efficiency.

Since the lower surface of the die-pad 10 is exposed outside the resin block 16, water will not accumulate at the interface between the lower surface of the die-pad 10 and the resin block 16. Thus, no water will evaporate in the package due to the heat externally applied to the semiconductor device when the device is mounted on the printed circuit board. Nor will develop cracks in the package due to wafer vapor.

A plurality of tie-bars 17 extend from the corner parts of the die-pad 10, which is a square member, toward the corner parts of the resin block (package) 16, respectively. The tie-bars 17 serve to tie the die-pad 10 to a lead frame in the course of manufacturing the semiconductor device.

The tie-bars 17 have one end exposed at the corner parts of the resin block 16, i.e., the rectangular package. The surfaces of the tie-bars 17, which are exposed, lie in substantially the same plane as the surfaces (lower surface and sides) of the resin block 16. That end of each tie-bar 17 serves as an outer electrode for applying the ground potential to the die-pad 10. Further, that end of each tie-bar 17 may be used as a holding part for increasing the mount strength of the semiconductor device with respect to a printed circuit board.

The plurality of leads 13 are arranged around the die-pad 10. Bonding wires 14 connect the leads 13 to the electrodes (pads) 15 of the semiconductor chip 11.

The plurality of leads 13 do not protrude from the resin block 16. That is, one end of each lead 13 is exposed at the edge part of the resin block 16, which is a rectangular package. The surfaces of the leads 13, which are exposed, lie in substantially the same plane as the surfaces (lower surface and sides) of the resin block 16. The end of each lead 13 serves as an outer electrode of the semiconductor device.

In the second example, the leads 13 and the tie-bars 17 are exposed at the lower surface and sides of the resin block (package) 16. The surfaces of the leads 13 and tie-bars 17, which are exposed, lie in substantially the same plane as the surfaces (lower surface and sides) of the resin block 16. Instead, the leads 13 and the tie-bars 17 may be exposed at only the lower surface of the package, and the surfaces of the leads 13 and tie-bars 17, which are exposed, may be placed in substantially the same plane as the lower surface of the package.

The leads 13 and tie-bars 17 are depressed in order to embed the leads 13 and tie-bars 17 in the resin block 16, except for their distal parts (outer electrodes), thereby to enhance the reliability of the semiconductor device. In the present invention, the ends of the leads 13 and tie-bars 17 lie in substantially the same plane as the surfaces (particularly, lower surface) of the resin block 16. Hence, the leads 13 and tie-bars 17 do not lie in the same plane and are prevented from slipping out of the resin block 16.

The die-pad 10, leads 13 and tie-bars 17 are made of metal such as copper, copper alloy or iron-nickel alloy (Fe—42Ni). The end portion (bonding portion) of each lead (inner lead) 13 is plated with metal such as gold or tin. The bonding wires 14 are made of metal such as copper, copper alloy or gold. The electrodes 15 of the semiconductor chip 11 are made of metal such as aluminum.

FIG. 20 depicts the semiconductor device of FIGS. 15 to 19, which is mounted on the printed circuit board. FIG. 21 is a sectional view, taken along line XXI—XXI in FIG. 20.

Wires 19A and 19B are formed on an insulting board 18 made of insulating material such as epoxy resin. The wires 19A and 19B are made from a film of metal such as copper or copper alloy. The wires 19A are arranged, corresponding to the ends (outer electrodes) of the leads 13 of the semiconductor device. The wires 19B are arranged, corresponding to the ends (used as outer electrodes or holding parts of the semiconductor device) of the tie-bars 17. The leads 13 are combined with the wires 19A, by the use of solder 20. Similarly, the tie-bars 17 are combined with the wires 19B, by the use of solder 20.

The lower surface of the die-pad 10 is exposed at the upper surface of the package, i.e., the resin block 16 (the surface facing away from the surface opposing the printed circuit board). The lower surface of the die-pad 10, which is exposed, lies in substantially the same plane as the upper surface of the resin block 16. The heat generated in the semiconductor chip is released from the semiconductor device through the die-pad 10. A heat radiator, such as heat-radiating fins, may be provided on the die-pad 10. Since water will not accumulate at the interface between the lower surface of the die-pad 10 and the resin block 16, no water will evaporate in a large amount in the semiconductor device in the process of mounting the device on the printed circuit board. Nor will develop cracks in the package due to water vapor.

In the second example of the resin-sealed semiconductor device according to this invention, the leads 13 are exposed at one end at the edge parts of a resin block 16, i.e., a rectangular package. The surfaces of the leads 13, which are exposed, lie in substantially the same plane as the surfaces (lower surface and sides) of the resin block 16. That is, the leads 13 do not extend from the package in the present invention. This can contribute to the miniaturization and thickness reduction of the semiconductor device.

In the second example of the resin-sealed semiconductor device according to this invention, the tie-bars 17 are exposed at one end at the corner parts of the package, i.e., the resin block 16. The surfaces of the tie-bars 17, which are exposed, lie in substantially the same plane as the surfaces (lower surface and sides) of the resin block 16. Further, the ground potential can be applied to the die-pad 10 since one end of each tie-bar 17 is used as an outer electrode. Thus, the entire lower surface of the semiconductor chip can be reliably set at the ground potential.

Even if one end of each tie-bar 17 is not used as an outer electrode, the mount strength of the semiconductor device can be increased, provided that that end of each tie-bar 17 is combined with a wire on the printed circuit board by the use of solder. That is, the semiconductor device can be firmly secured to the printed circuit board if that end of each tie-bar 17 is soldered to a wire on the board, no matter whether or not that end of the tie-bar serves as an outer electrode.

In the second example of the resin-sealed semiconductor device according to the present invention, the leads 13 and tie-bars 17 are depressed and are embedded in the resin block 16, except their distal end portions (outer electrodes). Hence, the die-pad 10, leads 13 and tie-bars 17 are prevented from slipping from the resin block 16. This helps to enhance the reliability of the device.

Further, in the second example of the resin-sealed semiconductor device according to the invention, the lower surface of the die-pad 10 is exposed outside the resin block (package) 16 and lies in substantially the same plane as the lower surface of the resin block 16. Hence, the heat generated in the semiconductor chip 11 is released from the semiconductor device through the die-pad 10. The semiconductor device therefore excels in terms of heat radiation efficiency.

To mount the semiconductor device on the printed circuit board, solder is melted with heat and then solidified, thereby combining the outer electrodes of the semiconductor device with the wires provided on the printed circuit board. At this time, however, the heat is conducted to the semiconductor device, too, by thermal conduction. The heat evaporates the water in the package. As is well known in the art, cracks will develop in the resin block (package) as the water evaporates, undergoing volume expansion.

In the second example of the resin-sealed semiconductor device, no water will accumulate at the interface between the lower surface of the die-pad 10 and the resin block 16, because the lower surface of the die-pad 10 is exposed outside the resin block 16. Thus, no water evaporates in the package in the process of mounting the semiconductor device on the printed circuit board. Nor will develop cracks in the package due to water vapor.

The package of the second example of the resin-sealed semiconductor device according to the present invention can be made about 0.8 mm or less thick. Obviously, the package of the semiconductor device of the invention is thinner than the package of the conventional BGA (Ball Grid Array) package that has a thickness of about 1.4 mm. In the second example of the semiconductor device, solder balls can be formed on those ends of the leads 13 and tie-bars 17, which serve as outer electrodes, thereby to form a BGA package.

Figure 22:
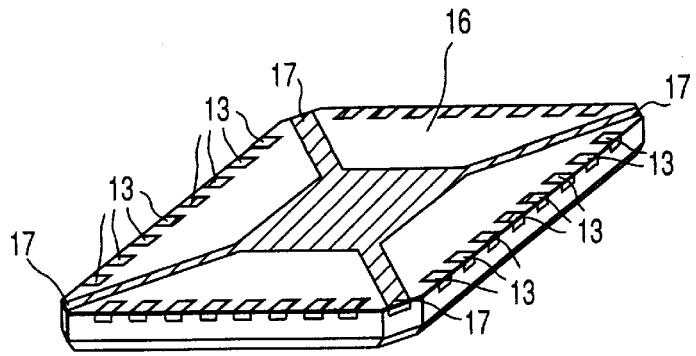
FIG. 22 is a perspective view depicting a third example of the semiconductor device according to this invention.

FIG. 22 shows an outer appearance of the third example of the resin-sealed semiconductor device according to the present invention.

The third example of the semiconductor device has all features of the first example of the semiconductor device, which has been described, and also specific features not found in the second example.

A plurality of leads 13 are exposed at one end at the edge parts of a resin block 16, i.e., a rectangular package. The surfaces of the leads 13, which are exposed, lie in substantially the same plane as the surfaces (lower surface and sides) of the resin block 16. That end of each lead 13 serves as an outer electrode of the semiconductor device. Since the leads 13 are depressed, they would not slip from the resin block 16.

Further, the die-pad 10 and tie-bars 17 are exposed outside the resin block 16, and the surfaces of the die-pad 10 and tie-bars 17, which re exposed, lie in substantially the same plane as the surfaces (lower surface and sides) of the resin block 16. Namely, neither the die-pad 10 nor the tie-bars 17 are depressed in this example. Even in this case, the die-pad 10 and the tie-bars 17 contact the resin block 16 at large areas and hardly slips from the resin block 16.

These features of the device contribute to the miniaturization and thickness reduction of the semiconductor device. In addition, the ground potential can be applied from the tie-bars 17 to the die-pad, making it possible to set reliably the entire lower surface of the semiconductor chip at the ground potential.

Furthermore, the tie-bars 17 serve to increase the mount strength of the semiconductor device with respect to a printed circuit board. For example, if the tie-bars 17 are secured at one end to the wires of a printed circuit board by the use of solder, the semiconductor device will be firmly secured to the printed circuit board.

Moreover, the lower surface of the die-pad 10 (the surface opposing the surface on which the semiconductor chip is arranged) is exposed outside the resin block 16 and lies in substantially the same plane as the surface (lower surface) of the resin block 16. Therefore, the heat in the semiconductor chip can be efficiently released from the semiconductor device, and it is possible to prevent cracks from developing in the resin block 16.

Figure 23:
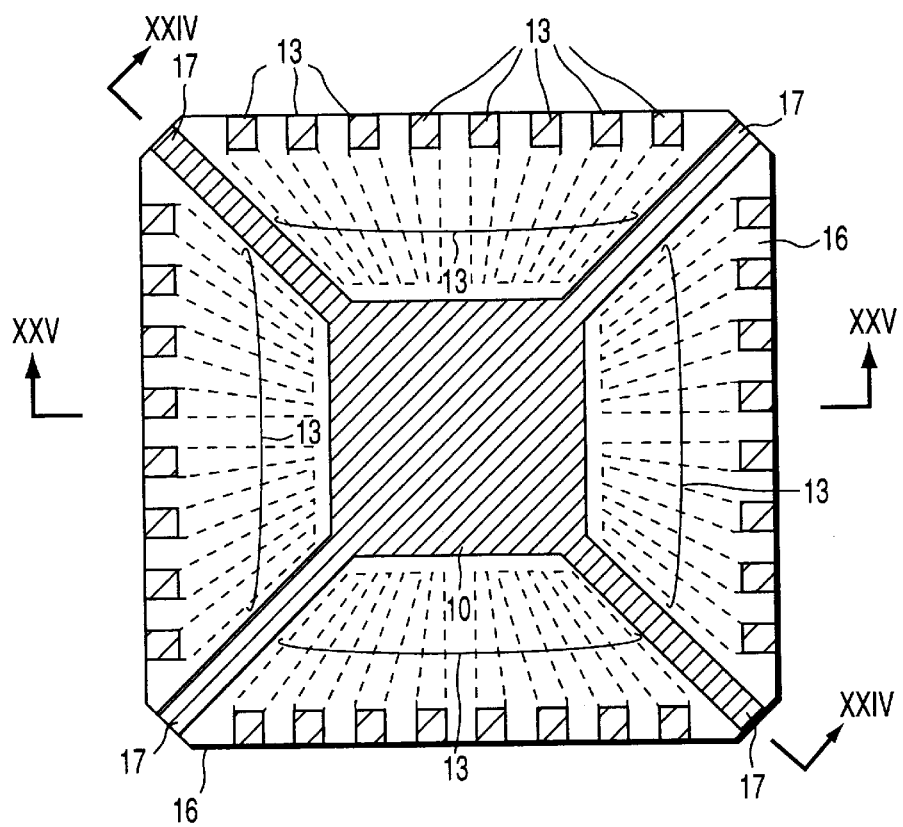
FIG. 23 is a plan view showing the third example of the semiconductor device according to the invention.
Figure 24:
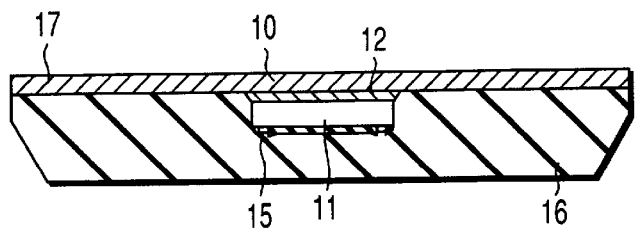
FIG. 24 is a sectional view, taken along line XXIV—XXIV in FIG. 23.
Figure 25:
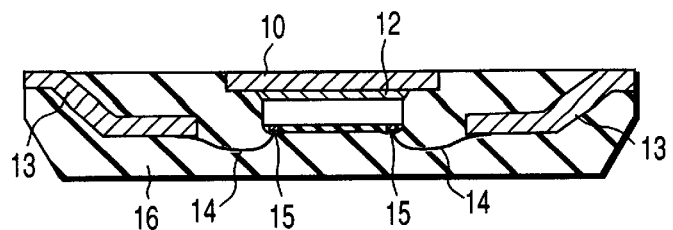
FIG. 25 is a sectional view, taken along line XXV—XXV in FIG. 23.

FIG. 23 is a plan view showing the third example of the resin-sealed semiconductor device according to the invention. FIG. 24 is a sectional view, taken along line XXIV—XXIV in FIG. 23, and FIG. 25 is a sectional view, taken along line XXV—XXV in FIG. 23.

The third example of the semiconductor device according to this invention differs from the first example described above, in that the lower surface of the die-pad 10 (the surface opposing the surface on which the semiconductor chip is arranged) is exposed outside the resin block 16 and lies in substantially the same plane as the surface (lower surface) of the resin block 16.

In the second example of the semiconductor device described above, the lower surface of the die-pad 10 is exposed at that surface (upper surface) of the resin block 16, which opposes the surface at which the leads 13 and tie-bars 17 are exposed. By contrast, in the third example of the semiconductor device, the lower surface of the die-pad 10 is exposed at that surface (lower surface) of the resin block 16, at which the leads 13 and tie-bars 17 are exposed. Hence, the die-pad 10 and tie-bars 17 have one surface completely exposed outside the resin block (package) 16.

The third example of the semiconductor device will be described below in detail.

A semiconductor chip 11 is mounted on the die-pad 10. The semiconductor chip 11 is fixed to the die-pad 10 with electrically conductive adhesive 12 such as silver paste. The resin block 16 covers up the die-pad 10 and the semiconductor chip 11. The lower surface of the die-pad 10 is exposed outside the resin block 16 and lies in substantially the same plane as the surface (lower surface) of the resin block 16.

Therefore, the heat generated in the semiconductor chip 11 is released from the semiconductor device through the die-pad 10. The semiconductor device excels in terms of heat radiation efficiency.

Since the lower surface of the die-pad 10 is exposed outside the resin block 16, water will not accumulate at the interface between the lower surface of the die-pad 10 and the resin block 16. Thus, no water will evaporate in the package due to the heat externally applied to the semiconductor device when the device is mounted on the printed circuit board. Nor will develop cracks in the package due to water vapor.

A plurality of tie-bars 17 extend from the corner parts of the die-pad 10, which is a square member, toward the corner parts of the resin block (package) 16, respectively. The tie-bars 17 serve to tie the die-pad 10 to a lead frame in the course of manufacturing the semiconductor device.

Neither the die-pad 10 nor the tie-bars 17 are depressed. Rather, the die-pad 10 and the tie-bars 17 lie in the same plane. Hence, the die-pad 10 and tie-bars 17 have one surface completely exposed outside the resin block (package) 16.

The die-pad 10 and tie-bars 17 serve as, for example, outer electrodes of the semiconductor device, for applying the ground potential to the die-pad 10. The die-pad 10 and tie-bars 17 may also be used as holding parts to increase the mount strength of the semiconductor device with respect to a printed circuit board.

A plurality of leads 13 are arranged around the die-pad 10. Bonding wires 14 connect the leads 13 to the electrodes (pads) 15 of the semiconductor chip 11.

The plurality of leads 13 do not protrude from the resin block 16. That is, one end of each lead 13 is exposed at the edge part of the resin block 16, which is a rectangular package. The surfaces of the leads 13, which are exposed, lie in substantially the same plane as the surfaces (lower surface and sides) of the resin block 16. The end of each lead 13 serves as an outer electrode of the semiconductor device.

Since the leads 13 are depressed, they would not slip from the resin block 16.

In the third example, the die-pad 10 and tie-bars 17 are exposed at the lower surface and sides of the resin block (package) 16, and the surfaces of the die-pad 10 and tie-bars 17, which are thus exposed, lie in substantially the same plane as the lower surface and sides of the resin block (package) 16. Instead, the leads 13 and the tie-bars 17 may be exposed at only the lower surface of the package, and the surfaces of the leads 13 and tie-bars 17, which are exposed, may be placed in substantially the same plane as the lower surface of the package.

The die-pad 10, leads 13 and tie-bars 17 are made of metal such as copper, copper alloy or iron-nickel alloy (Fe—42Ni). The end portion (bonding portion) of each lead (inner lead) 13 is plated with metal such as gold or tin. The bonding wires 14 are made of metal such as copper, copper alloy or gold. The electrodes 15 of the semiconductor chip 11 are made of metal such as aluminum.

Figure 26:
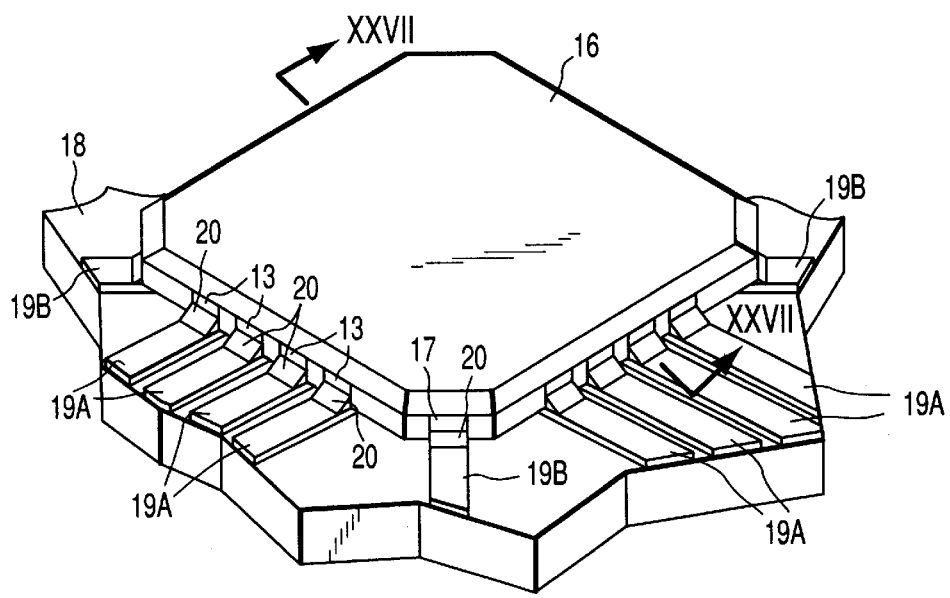
FIG. 26 is a perspective view showing the semiconductor device of FIGS. 22 to 25 mounted on a printed circuit board.
Figure 27:
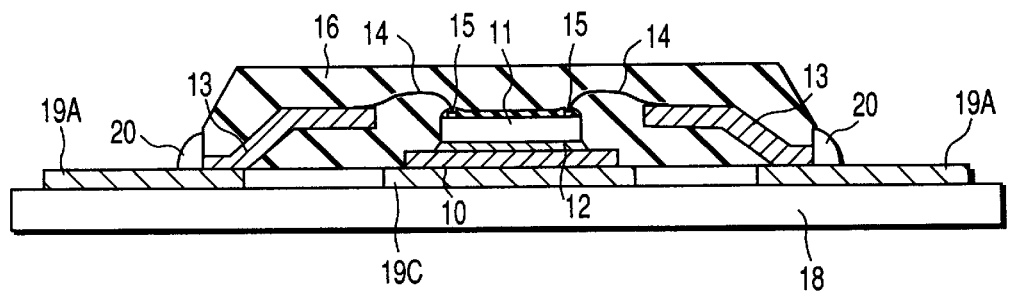
FIG. 27 is a sectional view, taken along line XXVII—XXVII in FIG. 26.

FIG. 26 shows the resin-sealed semiconductor device of FIGS. 22 to 25, mounted on a printed circuit board. FIG. 27 is a sectional view, taken along line XXVII—XXVII in FIG. 26.

Wires 19A and 19B are formed on an insulting board 18 made of insulating material such as epoxy resin. The wires 19A and 19B are made from a film of metal such as copper or copper alloy. The wires 19A are arranged, corresponding to the ends (outer electrodes) of the leads 13 of the semiconductor device. The wires 19B are arranged, corresponding to the ends (used as outer electrodes or holding parts of the semiconductor device) of the tie-bars. Wires 19C are provided on the printed circuit board, corresponding to the die-pad 10 of the semiconductor device.

The leads 13 are combined with the wires 19A, by the use of solder 20. Similarly, the tie-bars 17 are combined with the wires 19B, by the use of solder 20. The wires 19C may be combined with the lower surface of the die-pad 10 with solder or adhesive.

The lower surface of the die-pad 10 is exposed at the lower surface of the resin block (package) 16 (i.e., the surface opposing the printed circuit board) and lies in substantially the same plane as the surface (lower surface) of the resin block 16. Hence, the heat generated in the semiconductor chip 11 is released from the semiconductor device through the die-pad 10. In addition, since no water will accumulate at the interface between the lower surface of the die-pad 10 and the resin block 16, no water evaporates in the package in the process of mounting the semiconductor device on the printed circuit board. Nor will develop cracks in the package due to water vapor.

In the third example of the resin-sealed semiconductor device according to this invention, the leads 13 are exposed at one end at the edge parts of a resin block 16, i.e., a rectangular package. The surfaces of the leads 13, which are exposed, lie in substantially the same plane as the surfaces (lower surface and sides) of the resin block 16. That is, the leads 13 do not extend from the package in the present invention. This can contribute to the miniaturization and thickness reduction of the semiconductor device.

In the third example of the resin-sealed semiconductor device according to this invention, neither the die-pad 10 nor the tie-bars 17 are depressed. Rather, the die-pad 10 and the tie-bars 17 lie in the same plane. Further, the die-pad 10 and tie-bars 17 have one surface completely exposed outside the resin block (package) 16. Still further, the surfaces of the die-pad 10 and tie-bars 17, which are exposed outside the resin block 16, lie in substantially the same plane as the surface (lower surface) of the resin block 16.

Therefore, the ground potential can be applied to the die-pad 10 by using the die-pad 10 or the tie-bars 17 as outer electrodes. The entire lower surface of a semiconductor chip can thereby reliably set at the ground potential.

Further, if the lower surface of the die-pad 10 is combined with the wires 19C on the printed circuit board by the use of, for example, solder, the mount strength of the semiconductor device can be increased. That is, if the lower surface of the die-pad 10 is soldered to the wires 19C on the printed circuit board, the semiconductor device can be firmly secured to the printed circuit board.

In the third example of the resin-sealed semiconductor device according to this invention, the leads 13 are depressed and embedded in the resin block 16, except for their distal parts (outer electrodes). Thus, the leads 13 of the semiconductor device can be prevented from slipping from the resin block 16, thereby to enhance the reliability of the semiconductor device.

Further, in the third example of the resin-sealed semiconductor device according to this invention, the lower surfaces of the die-pad 10 and tie-bars 17 are exposed outside the resin block 16 and lie in substantially the same plane as the surface (lower surface) of the resin block 16. The heat generated in the semiconductor chip 11 is therefore released from the semiconductor device through the die-pad 10. The semiconductor device excels in terms of heat radiation efficiency.

Still further, in order mount the semiconductor device on the printed circuit board, solder is melted with heat and then solidified, thereby combining the outer electrodes of the semiconductor device with the wires provided on the printed circuit board. In the third example of the resin-sealed semiconductor device, no water will accumulate at the interface between the lower surface of the die-pad 10 and the resin block 16 since the lower surface of the die-pad 10 is exposed outside the resin block 16. Namely, no water evaporates in the package in the process of mounting the semiconductor device on the printed circuit board. Nor will develop cracks in the package due to water vapor.

The package of the third example of the resin-sealed semiconductor device according to the present invention can be made about 0.8 mm thick or less. Obviously, the package of the semiconductor device of the invention is thinner than the package of the conventional BGA (Ball Grid Array) package that has a thickness of about 1.4 mm. In the second example of the semiconductor device, solder balls can be formed on those ends of the leads 13 and tie-bars 17, which serve as outer electrodes, thereby to form a BGA package.

Figure 28:
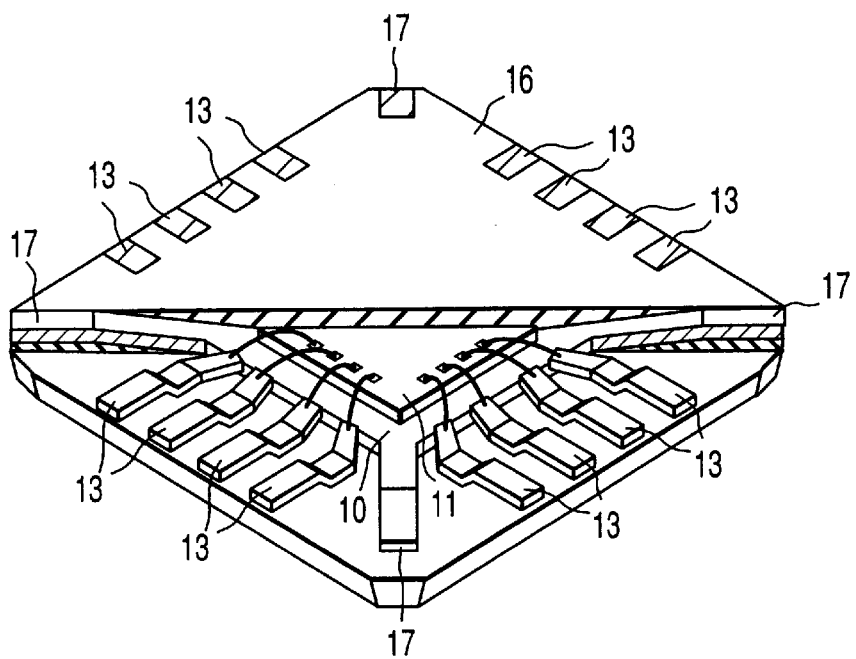
FIG. 28 is a perspective view illustrating the first or second example of the semiconductor device according to the invention.

FIG. 28 is a perspective view showing the first or second example of the semiconductor device according to the invention.

In FIG. 28, the semiconductor device is shown, with a part of the resin block 16 removed so that the internal structure thereof can be seen. This device will be identical to the first example if the lower surface of the die-pad 10 is not exposed, and will be identical to the second example if the lower surface of the die-pad 10 is exposed.

Figure 29:
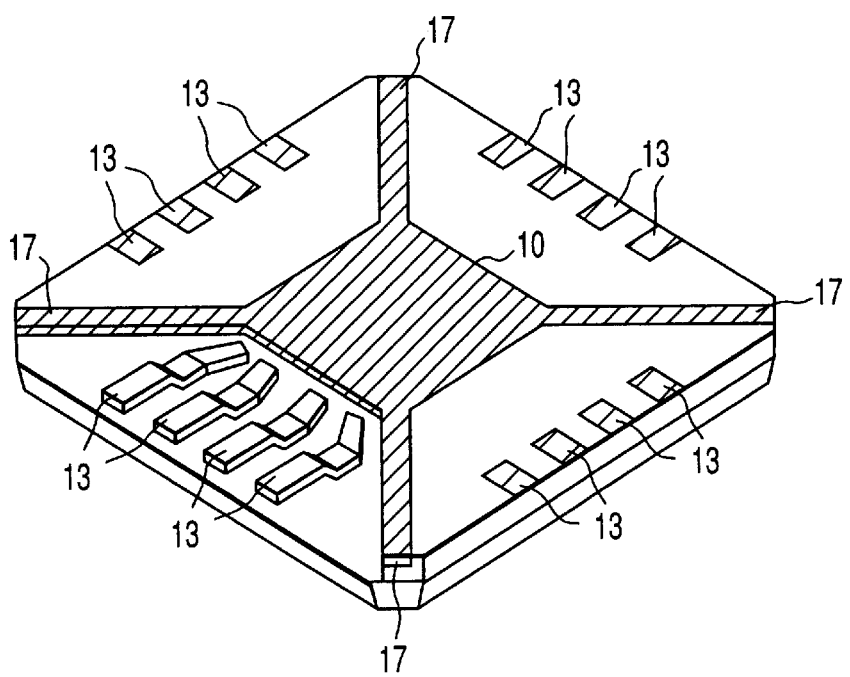
FIG. 29 is a perspective view showing the third example of the semiconductor device according to this invention.

FIG. 29 shows the third example of the semiconductor device according to this invention.

In FIG. 29, the semiconductor device is illustrated, with a part of the resin block 16 removed so that the internal structure thereof can be seen. The third example differs from the first and second examples in that the die-pad 10, leads 13 and tie-bars 17 are exposed at the same surface (i.e., the lower surface of the package).

Figure 30:
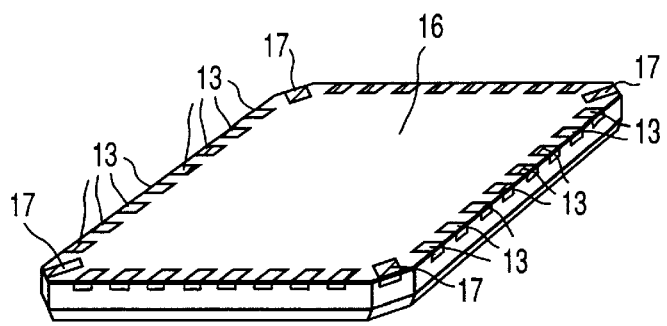
FIG. 30 is a perspective view depicting a fourth example of the semiconductor device according to the present invention.

FIG. 30 depicts an outer appearance of the fourth example of the resin-sealed semiconductor device according to the present invention.

In view of its outer appearance the fourth example is the same as the above-described first example of the semiconductor device.

A plurality of leads 13 are exposed at one end at the edge parts of a resin block 16, i.e., a rectangular package. The surfaces of the leads 13, which are exposed, lie in substantially the same plane as the surfaces (lower surface and sides) of the resin block 16. One end of each lead 13 serves as an external electrode of the semiconductor device.

These features of the device contribute to the miniaturization and thickness reduction of the semiconductor device. In addition, the ground potential can be applied from the tie-bars 17 to the die-pad, making it possible to set reliably the entire lower surface of the semiconductor chip at the ground potential.

Further, the tie-bars 17 serve to increase the mount strength of the semiconductor device with respect to a printed circuit board. For example, if the tie-bars 17 are secured at one end to the wires of a printed circuit board by the use of solder, the semiconductor device will be firmly secured to the printed circuit board.

Figure 31:
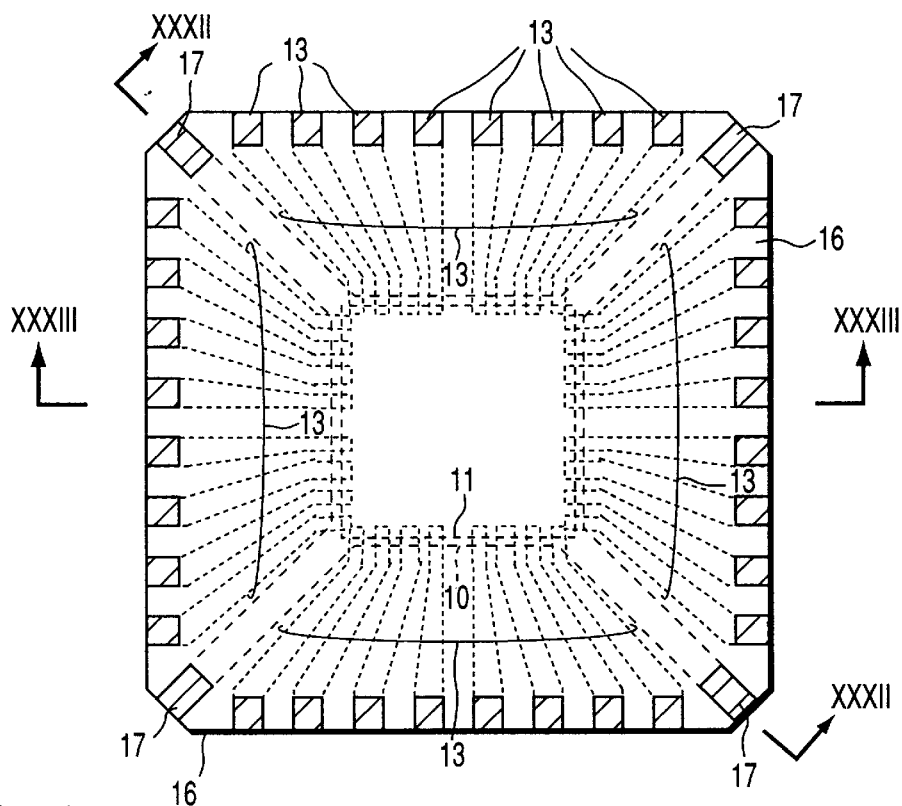
FIG. 31 is a plan view of the fourth example of the semiconductor device according to the invention.
Figure 32:
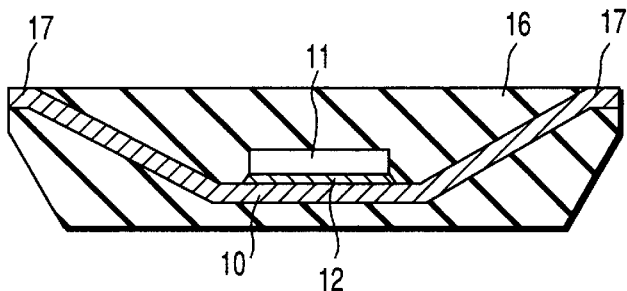
FIG. 32 is a sectional view, taken along line XXXII—XXXII in FIG. 31.
Figure 37:
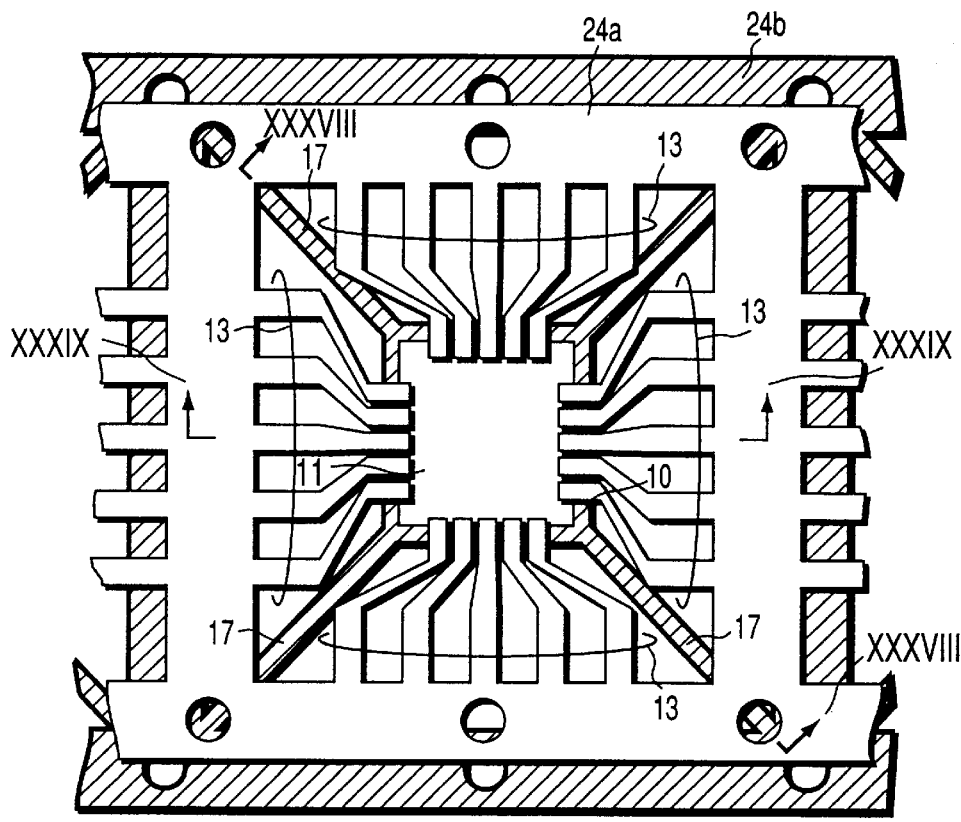
FIG. 37 is a plan view of the structure of FIG. 36 and a semiconductor chip connected to the structure.
Figure 38:
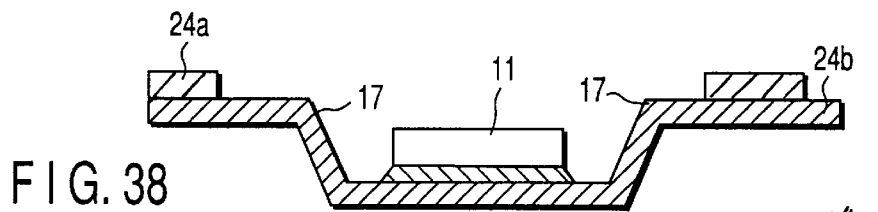
FIG. 38 is a sectional view, taken along line XXXVIII—XXXVIII in FIG. 37.
Figure 39:
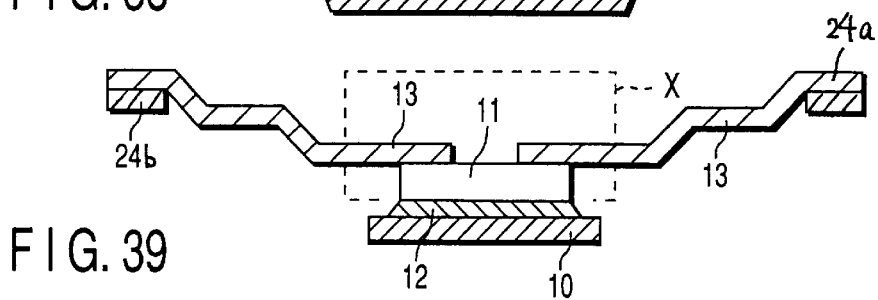
FIG. 39 is a sectional view, taken along line XXXIX—XXXIX in FIG. 37.
Figure 40:
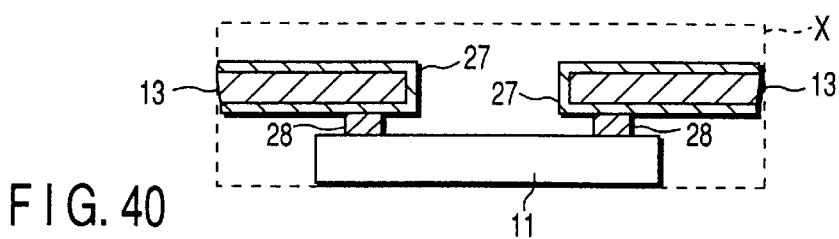
FIG. 40 is a sectional view showing the part X of FIG. 39 in detail.

FIG. 31 is a plan view of the fourth example of the semiconductor device according to the invention. FIG. 32 is a sectional view, taken along line XXXII—XXXII in FIG. 31, and FIG. 33 is a sectional view, taken along line XXXIII—XXXIII in FIG. 31.

The fourth example of the semiconductor device according to this invention differs from the first example described above, in that the semiconductor chip and the leads are connected by bumps, not by bonding wires.

The fourth example of the semiconductor device will be described below in detail.

A semiconductor chip 11 is mounted on the die-pad 10. The semiconductor chip 11 is fixed to the die-pad 10 with electrically conductive adhesive 12 such as silver paste. The resin block 16 covers up the die-pad 10 and the semiconductor chip 11. A plurality of tie-bars 17 extend from the corner parts of the die-pad 10, which is a square member, toward the corner parts of the resin block (package) 16, respectively. The tie-bars 17 are exposed outside the resin block 16. The surfaces of the tie-bars 17, which are exposed, lie in substantially the same plane as the surfaces (lower surface and sides) of the resin block 16.

The tie-bars 17 serve to tie the die-pad 10 to a lead frame in the course of manufacturing the semiconductor device. After the manufacture of the device, the tie-bars 17 serves as, for example, outer electrodes of the semiconductor device, for applying the ground potential to the die-pad 10. Further, the tie-bars 17 may be used as holding parts to increase the mount strength of the semiconductor device with respect to a printed circuit board.

A plurality of leads 13 are arranged around the die-pad 10. The leads 13 are directly connected to the electrodes (bumps) of the semiconductor chip 11. The plurality of leads 13 do not protrude from the resin block 16. That is, one end of each lead 13 is exposed at the edge part of the resin block 16, which is a rectangular package. The surfaces of the leads 13, which are exposed, lie in substantially the same plane as the surfaces (lower surface and sides) of the resin block 16. The end of each lead 13 serves as an outer electrode of the semiconductor device.

In the fourth example, the leads 13 and tie-bars 17 are exposed at the lower surface and sides of the resin block (package) 16. The surfaces of the leads 13 and tie-bars 17, which are thus exposed, lie in substantially the same plane as the lower surface and sides of the resin block (package) 16. Instead, the leads 13 and tie-bars 17 may be exposed at only the lower surface of the package, and the surfaces of the leads 13 and tie-bars 17, which are exposed, may be placed in substantially the same plane as the lower surface of the package.

The die-pad 10, leads 13 and tie-bars 17 are made of metal such as copper, copper alloy or iron-nickel alloy (Fe—42Ni). The end portion (bonding portion) of each lead (inner lead) 13 is plated with metal such as gold or tin. Bonding wires 14 are made of metal such as copper, copper alloy or gold. The electrodes 15 of the semiconductor chip 11 are made of metal such as aluminum.

FIGS. 34 and 35 show two types of lead frames for use in the resin-sealed semiconductor device of FIGS. 30 to 33.

Two lead frames 24a and 24b of different types are used in the manufacture of the fourth example of the semiconductor device. The lead frame 24a has a plurality of leads 13, whereas the lead frame 24b has tie-bars 17 for tying the die-pad 10.

Both lead frames 24a and 24b are rectangular, short in X direction and long in Y direction. A plurality of sprocket holes 21 are made in and arranged along the two edge parts of each lead frame (24a, 24b) which are spaced apart in the X direction. The leads 13 are combined, at one end, to the lead frame 24a. The die-pad 10 is tied to the lead frame 24b by the tie-bars 17. The tie-bars 17 are combined at one end with the lead frame 24b and at the other end with the corner parts of the die-pad 10 that is a square member. The leads 13 and the tie-bars 17 are depressed.

FIG. 36 illustrates how the two types of the read frames shown in FIGS. 34 and 35 are used.

As shown in FIG. 36, the lead frames 24a and 24b are combined together in the course of manufacturing the fourth example of the semiconductor device. More specifically, as shown in FIGS. 37 to 40, the semiconductor chip 11 is secured to the die-pad 19 provided on the lead frame 24b by using adhesive. The lead frame 24a is placed on the lead frame 24b holding the semiconductor chip 11. At this time the distal ends of the leads 13 of the lead frame 24a contact the bumps 28 provided on the semiconductor chip 11. Ultrasonic heating is conducted, while applying a prescribed pressure on the bumps 28, whereby the semiconductor chip 11 are combined with the leads 13. In the fourth example, the leads (lead frame) 13 are made of, for example, copper (Cu), and the distal ends of the leads 13 are plated with, for example, gold (Au).

In the fourth example of the resin-sealed semiconductor device according to the invention, the leads 13 have one end exposed at the edge parts of the resin block (package) 16. The surfaces of the leads 13, which are exposed outside the resin block 16, lie in substantially the same plane as the surfaces (lower surface and sides) of the resin block 16. That is, the leads 13 do not protrude from the resin block 16 in the present example. This contributes to the miniaturization and thickness reduction of the semiconductor device.

In the fourth example of the resin-sealed semiconductor device according to this invention, the tie-bars 17 have one end exposed at the corner parts of the package, i.e., the resin block 16. The surfaces of the tie-bars 17, which are exposed, lie in substantially the same plane as the surfaces (lower surface and sides) of the resin block 16. Further, the ground potential can be applied to the die-pad 10 by using one end of each tie-bar 17 as an outer electrode. Thus, the entire lower surface of the semiconductor chip can be reliably set at the ground potential.

The mount strength of the semiconductor device with respect to the printed circuit board may be increased by combining the tie-bars 17 at one end with the wires provided on the printed circuit board. For example, if the tie-bars 17 are secured at one end to the wires, by using solder, the semiconductor device will be firmly fixed to the printed circuit board.

In the fourth example of the resin-sealed semiconductor device according to the invention, the leads 13 and tie-bars 17 are depressed in order to embed the leads 13 and tie-bars 17 in the resin block 16, except for their distal parts (outer electrodes), thereby to enhance the reliability of the semiconductor device. Hence, the die-pad 10, leads 13 and all tie-bars 17 are prevented from slipping out of the resin block 16. This helps to enhance the reliability of the semiconductor device.

Further, in the fourth example of the resin-sealed semiconductor device according to the invention, the semiconductor chip 11 and the leads 13 are connected by bumps 28, not by bonding wires. In this case, the package can be made smaller in both the widthwise direction and the vertical direction (thickness). That is, the package can be made small and thin.

The package of the fourth example of the resin-sealed semiconductor device according to the present invention can be made about 0.8 mm thick or less. Obviously, the package of the semiconductor device of the invention is thinner than the package of the conventional BGA (Ball Grid Array) package that has a thickness of about 1.4 mm. In the second example of the semiconductor device, solder balls can be formed on those ends of the leads 13 and tie-bars 17, which serve as outer electrodes, thereby to form a BGA package.

In the first to fourth examples of the resin-sealed semiconductor device, all outer electrodes are exposed at the lower surface of the resin block (package) 16, and the surfaces of the outer electrodes lie in the same plane as the lower surface of the resin block 16. Hence, a plurality of semiconductor devices can be mounted on a printed circuit board, all at a time, by the use of a reflow furnace.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resin-sealed semiconductor device comprising:

a die-pad;

a semiconductor chip arranged on the die-pad;

a tie-bar having a first end and a second end, said first end combined with the die-pad;

a lead having a first end and a second end;

a resin block covering up the die-pad, the semiconductor chip, the tie-bar and the lead and having an upper surface, a lower surface and sides, wherein the second end of the tie-bar and the second end of the lead are exposed at the lower surface of the resin block, and surfaces of the tie-bar and lead, which are exposed outside the resin block, lie in substantially the same plane as at least the lower surface of the resin block.

2. A resin-sealed semiconductor device according to claim 1, wherein a lower surface of the die-pad is exposed at the upper surface of the resin block and lies in substantially the same plane as the upper surface of the resin block.

3. A resin-sealed semiconductor device according to claim 1, wherein a lower surface of the die-pad is exposed at the upper surface of the resin block and lies in substantially the same plane as the lower surface of the resin block.

4. A resin-sealed semiconductor device according to claim 1, further comprising a bonding wire connecting the first end of the lead and the semiconductor chip.

5. A resin-sealed semiconductor device according to claim 1, further comprising a bump connecting the first end of the lead and the semiconductor chip.

6. A resin-sealed semiconductor device according to claim 1, wherein the tie-bar and the lead are depressed.

7. A resin-sealed semiconductor device according to claim 2, wherein the tie-bar and the lead are depressed.

8. A resin-sealed semiconductor device according to claim 3, wherein the die-pad and the tie-bar are arranged in the same plane, and the lead is depressed.

9. A resin-sealed semiconductor device according to claim 1, wherein the resin block is rectangular, the second end of the tie-bar is exposed at a corner part of the resin block, and the second end of the lead is exposed at an edge part of the resin block.

10. A resin-sealed semiconductor device according to claim 9, wherein surfaces of the tie-bar and lead, which are exposed outside the resin block, lie in substantially the same plane as a side of the resin block.

11. A resin-sealed semiconductor device according to claim 1, wherein the tie-bar is connected to a first wire provided on a printed circuit board, and the lead is connected to a second wired provided on the printed circuit board.

12. A lead frame for use in a resin-sealed semiconductor device, comprising:

a main body;

a die-pad for supporting a semiconductor chip;

a tie-bar having a first end and a second end, said second combined with the main body; and a lead having a first end arranged near the die-pad and a second end combined with the main body;

wherein the die-pad, the tie-bar and the lead are depressed, the first end of the lead is located closer to the main body than to the die-pad, and the second end of the tie-bar and the second end of the lead lie in a plane defined by the main body.

13. A lead frame according to claim 12, wherein the die-pad is a square member, and the first end of the tie-bar is combined with a corner part of the die-pad.

14. A lead frame according to claim 12, which further comprises a dam-bar combined with the lead and in which the lead is depressed at a part located closer to the first end of the lead than to the dam-bar.

* * * * *